(12) United States Patent
Song et al.

(10) Patent No.: US 9,329,415 B2
(45) Date of Patent: May 3, 2016

(54) METHOD FOR FORMING AN OPTICAL MODULATOR

(71) Applicant: Agency for Science, Technology and Research, Singapore (SG)

(72) Inventors: Jun-Feng Song, Singapore (SG);
Xianshu Luo, Singapore (SG);
Xiaoguang Tu, Singapore (SG); Patrick Guo-Qiang Lo, Singapore (SG);
Mingbin Yu, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/071,820

(22) Filed: Nov. 5, 2013

(65) Prior Publication Data

US 2014/0127842 A1 May 8, 2014

(30) Foreign Application Priority Data

Nov. 5, 2012 (SG) .................................. 201208158

(51) Int. Cl.
*G02F 1/025* (2006.01)
*G02B 6/12* (2006.01)
*H01L 29/15* (2006.01)
(Continued)

(52) U.S. Cl.
CPC .......... *G02F 1/025* (2013.01); *H01L 21/32125* (2013.01); *H01L 29/157* (2013.01); *H01L 29/4925* (2013.01); *H01P 11/001* (2013.01); *H01P 11/003* (2013.01); *G02B 2006/12097* (2013.01); *G02B 2006/12142* (2013.01);
(Continued)

(58) Field of Classification Search
CPC ... G02F 1/015; G02F 1/025; G02F 2201/063; G02F 2201/12; H01P 11/001; H01P 11/003; H01L 29/157; H01L 29/4925; H01L 21/32155
See application file for complete search history.

(56) References Cited

U.S. PATENT DOCUMENTS

| 4,030,943 A | 6/1977 | Lee et al. |
| 2005/0093036 A1 | 5/2005 | Han |

(Continued)

FOREIGN PATENT DOCUMENTS

| EP | 1204145 A2 | 5/2002 |
| SG | 182132 A1 | 7/2012 |

(Continued)

OTHER PUBLICATIONS

Kimerling et al, "Electronic-Photonic Integrated Circuits on the CMOS Platform," Proc. of SPIE, vol. 6125, 2006, pp. 1-10.

(Continued)

*Primary Examiner* — Thanhha Pham
(74) *Attorney, Agent, or Firm* — Winstead, P.C.

(57) ABSTRACT

According to embodiments of the present invention, a method for forming an optical modulator is provided. The method includes providing a substrate, implanting dopants of a first conductivity type into the substrate to form a first doped region, implanting dopants of a second conductivity type into the substrate to form a second doped region, wherein a portion of the second doped region is formed over and overlaps with a portion of the first doped region to form a junction between the respective portions of the first doped region and the second doped region, and wherein a remaining portion of the second doped region is located outside of the junction, and forming a ridge waveguide, wherein the ridge waveguide overlaps with at least a part of the junction.

21 Claims, 14 Drawing Sheets

(51) Int. Cl.
*H01P 11/00* (2006.01)
*H01L 21/3215* (2006.01)
*H01L 21/321* (2006.01)
*H01L 29/49* (2006.01)

(52) U.S. Cl.
CPC ....... *G02F2201/063* (2013.01); *G02F 2202/06* (2013.01); *G02F 2202/105* (2013.01)

(56) References Cited

U.S. PATENT DOCUMENTS

| | | |
|---|---|---|
| 2006/0133754 A1 | 6/2006 | Patel et al. |
| 2010/0060970 A1 | 3/2010 | Chen |
| 2010/0080504 A1 | 4/2010 | Shetrit et al. |
| 2010/0119190 A1 | 5/2010 | Gill et al. |
| 2011/0206313 A1* | 8/2011 | Dong et al. ............ 385/2 |
| 2012/0189239 A1 | 7/2012 | Tu et al. |
| 2013/0188902 A1* | 7/2013 | Gardes ............ G02F 1/025 385/2 |

FOREIGN PATENT DOCUMENTS

WO  2004088394 A2  10/2004
WO  2008105854 A1  9/2008

OTHER PUBLICATIONS

Mario Paniccia, "Integrating Silicon Photonics," Nature Photonics, vol. 4, Aug. 2010, pp. 498-499.

Reed et al., "Silicon Optical Modulators," Nature Photonics, vol. 4, Aug. 2010, pp. 518-526.

Michel et al., "High Performance Ge-on-Si Photodetectors," Nature Photonics, vol. 4, Aug. 2010, pp. 527-534.

Basak et al., "Developments in Gigascale Silicon Optical Modulators Using Free Carrier Dispersion Mechanisms," Advances in Optical Technologies, vol. 2008, Article ID 678948, 2008, pp. 1-10.

Liow et al., "Silicon Modulators and Germanium Photodetectors on SOI: Monolithic Integration, Compatibility, and Performance Optimization," IEEE Journal of Selected Topics in Quantum. Electronics, vol. 16, No. 1, Jan./Feb. 2010, pp. 307-315.

Feng et al., "High Speed Carrier-Depletion Modulators with 1.4V-cm VπL Integrated on 0.25 μm Silicon-on-Insulator Waveguides," Optics Express., vol. 18, No. 8, Apr. 12, 2010, pp. 7994-7999.

Liao et al., "40Gbit/s Silicon Optical Modulator for High-Speed Applications," Electronics Letters, vol. 43, No. 22, Oct. 25, 2007, pp. 1-2.

Gardes et al., "40 Gb/s Silicon Photonics Modulator for TE and TM Polarisations," Optics Express, vol. 19, No. 12, Jun. 6, 2011, pp. 11804-11814.

Written Opinion for Singapore Patent Application No. 2013082102 dated Dec. 9, 2014, pp. 1-16.

Search Report for Singapore Patent Application No. 2013082102 dated Dec. 9, 2014, pp. 1-9.

Written Opinion for Singapore Patent Application No. 2013082102 dated Aug. 5, 2015, pp. 1-13.

* cited by examiner

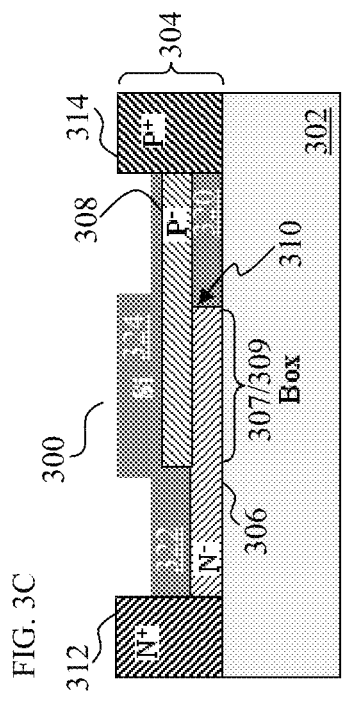
FIG. 3B
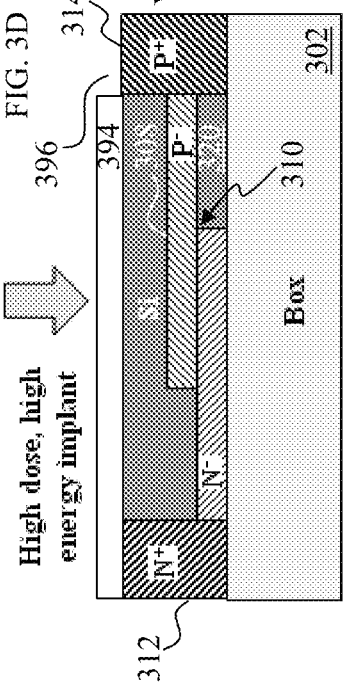
FIG. 3C / FIG. 3F
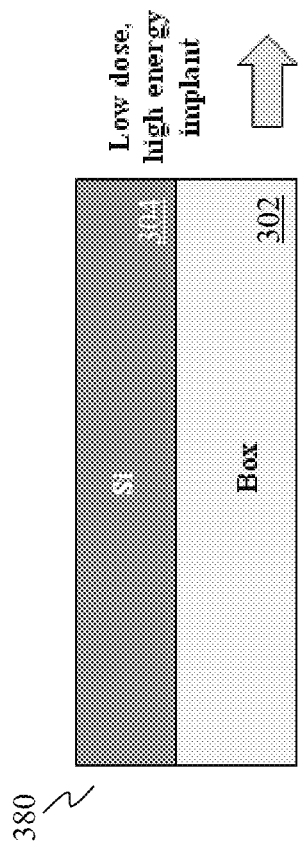
FIG. 3A
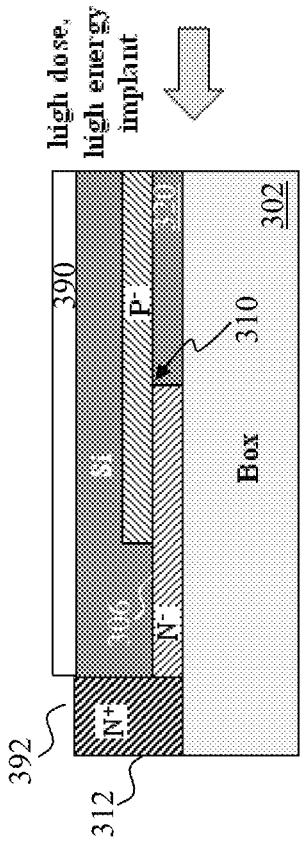
FIG. 3D / FIG. 3E

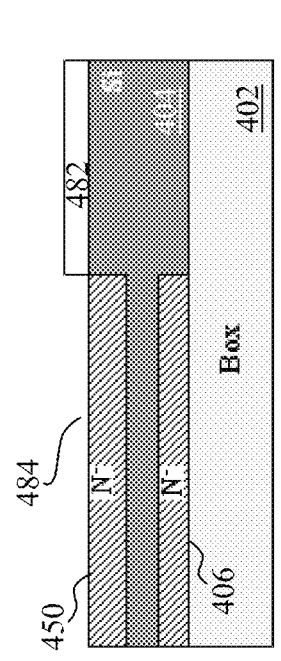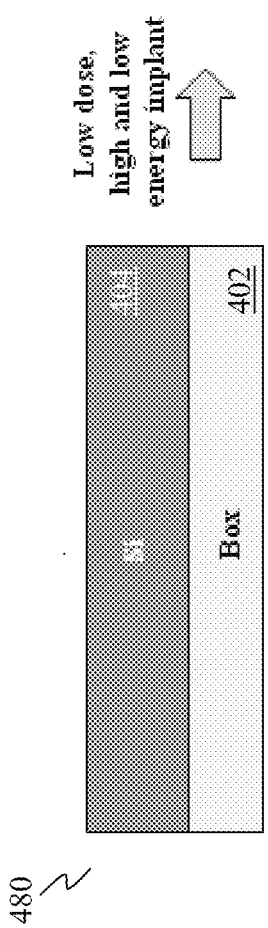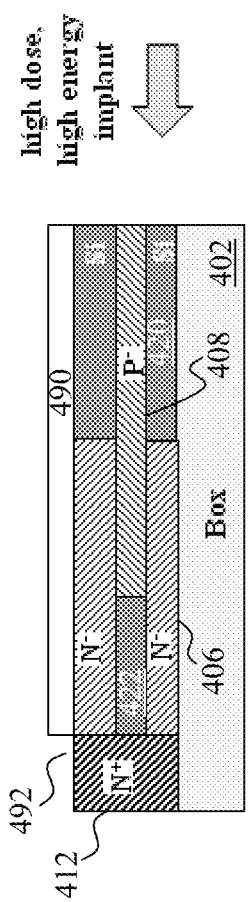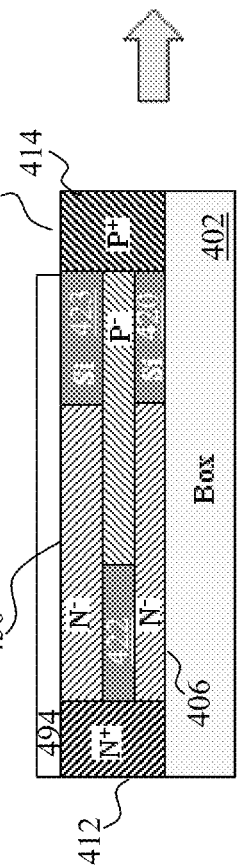

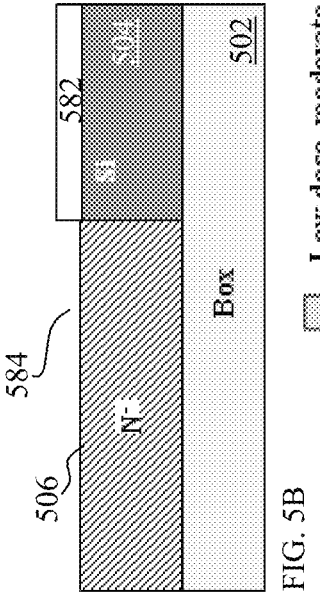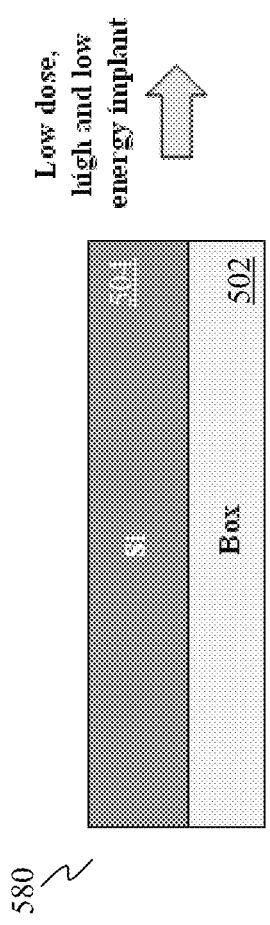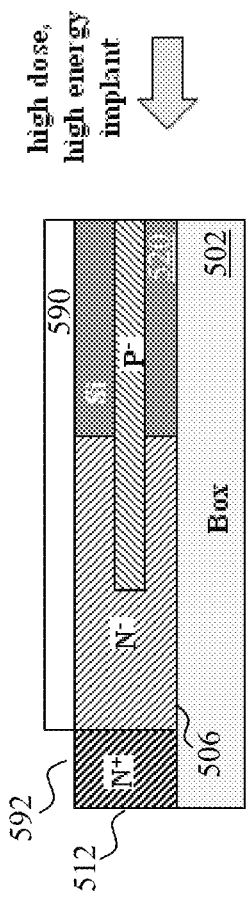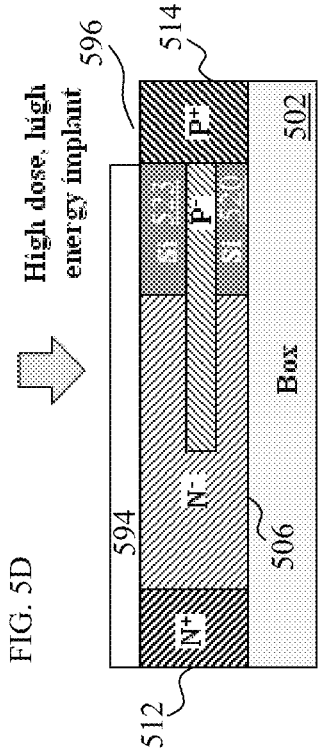

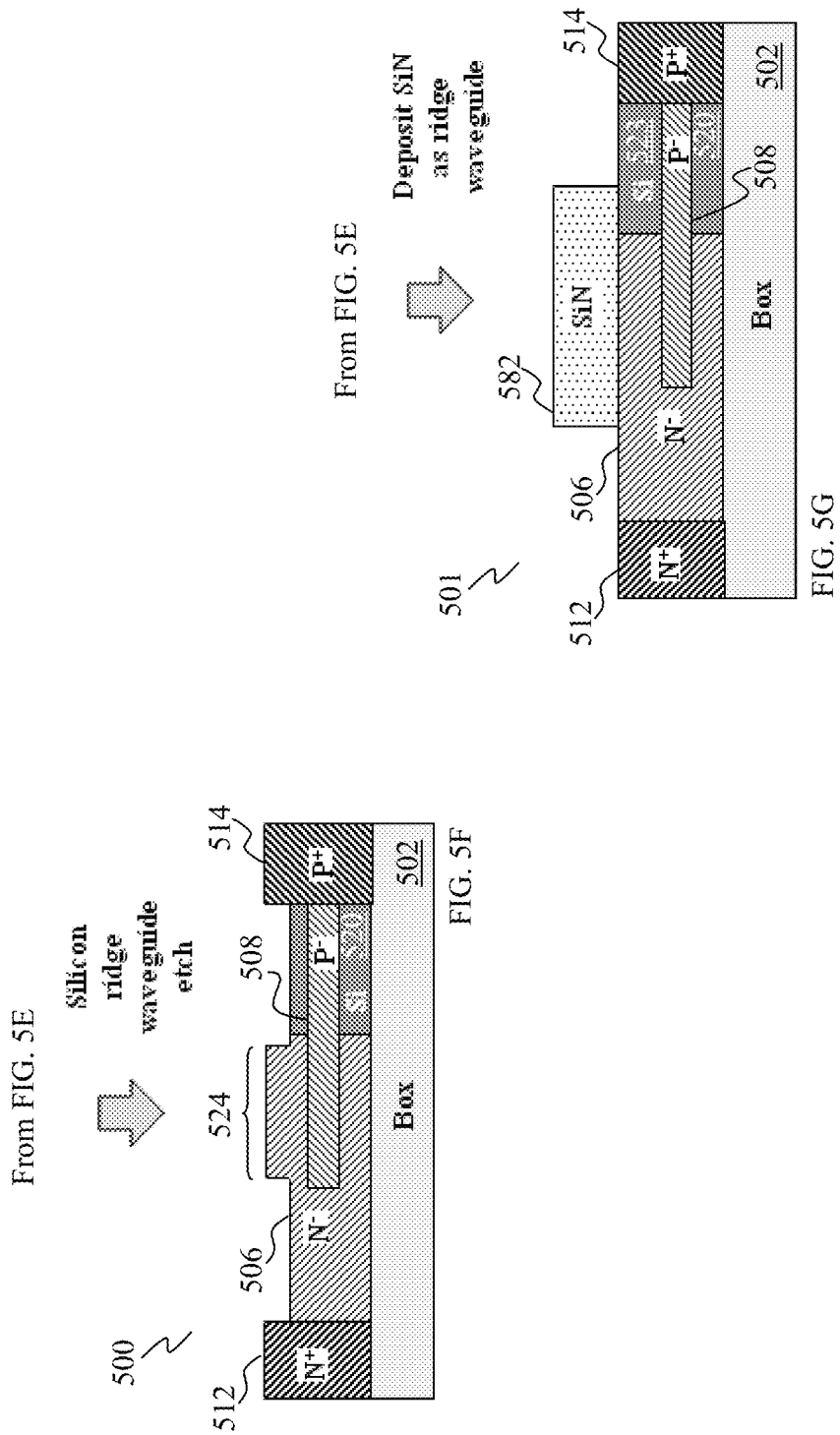

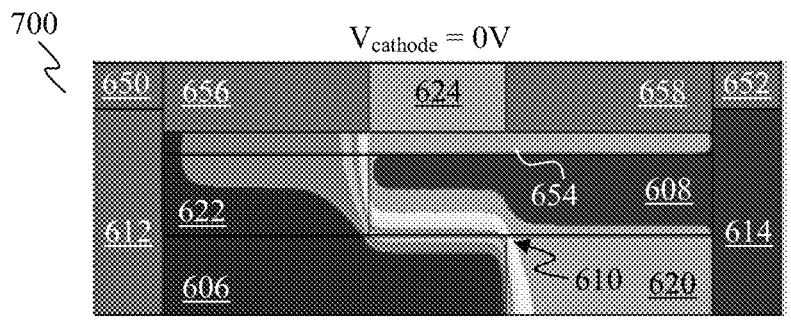
FIG. 7A
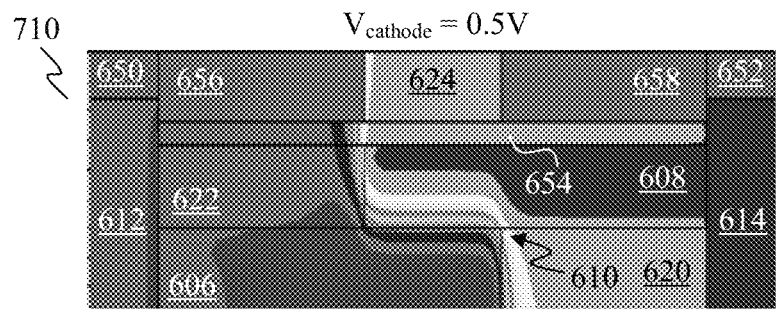
FIG. 7B
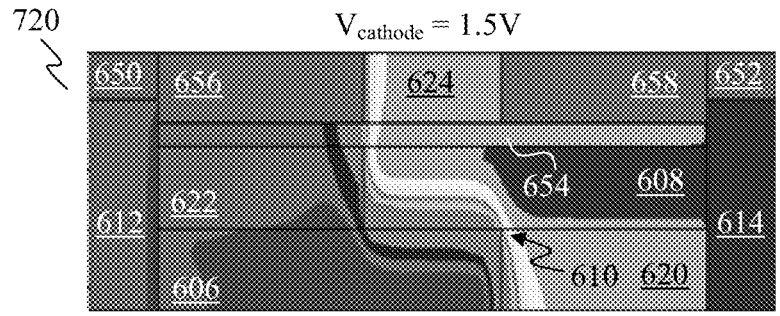
FIG. 7C
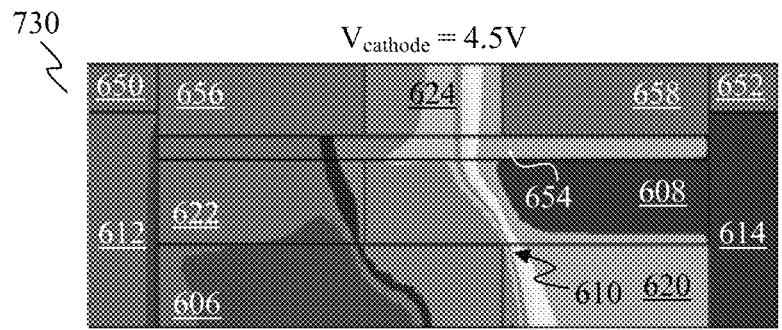
FIG. 7D
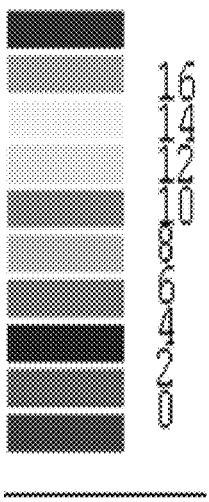

METHOD FOR FORMING AN OPTICAL MODULATOR

CROSS-REFERENCE TO RELATED APPLICATION

This application claims the benefit of priority of Singapore patent application No. 201208158-4, filed 5 Nov. 2012, the content of it being hereby incorporated by reference in its entirety for all purposes.

TECHNICAL FIELD

Various embodiments relate to a method for forming an optical modulator.

BACKGROUND

A high speed optical modulator is a key component for applications of optical communications and on-chip interconnection. A silicon-on-insulator (SOI) based optical modulator is promising due to its compact footprint, compatibility with complementary metal-oxide-semiconductor (CMOS) technique, easy large scale integration with electronics, and thus resulting in a lower cost. Various kinds of silicon-based optical modulators have been demonstrated with various performances. However, for conventional optical modulators, one issue is how to increase the modulation speed and to reduce the operation energy without complicating the device structure and the fabrication process.

Furthermore, conventional silicon based optical modulators may have one or more of the following issues: (1) relatively high optical loss due to the waveguide implantation induced absorption loss; (2) relatively complicated implantation/doping scheme, with multiple implantations with different energy levels and dosages, to fabricate modulators for high-speed operation (e.g. associated parasitic capacitance and resistance); or (3) relatively small overlap between the optical field and the free carrier changing region, resulting in a low modulation efficiency. The term "free carrier changing region" may mean a depletion region which may be an insulating region within a conductive, doped semiconductor material where the mobile charge carriers (electrons and/or holes) have diffused away, or have been forced away by an electric field. The only elements remaining in the depletion region are ionized donor or acceptor impurities. A depletion region may be formed across a PN junction.

SUMMARY

According to an embodiment, a method for forming an optical modulator is provided. The method may include providing a substrate, implanting dopants of a first conductivity type into the substrate to form a first doped region, implanting dopants of a second conductivity type into the substrate to form a second doped region, wherein a portion of the second doped region is formed over and overlaps with a portion of the first doped region to form a junction between the respective portions of the first doped region and the second doped region, and wherein a remaining portion of the second doped region is located outside of the junction, and forming a ridge waveguide, wherein the ridge waveguide overlaps with at least a part of the junction.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIGS. 3A to 3F show, as cross-sectional views, various processing stages of a method for forming an optical modulator, according to various embodiments.

FIGS. 4A to 4G show, as cross-sectional views, various processing stages of a method for forming an optical modulator, according to various embodiments.

FIGS. 5A to 5G show, as cross-sectional views, various processing stages of a method for forming an optical modulator, according to various embodiments.

FIGS. 7A to 7D show simulated free carrier distributions in a vertical PN diode for different DC (direct current) bias voltages respectively, according to various embodiments.

DETAILED DESCRIPTION

Figure 1:
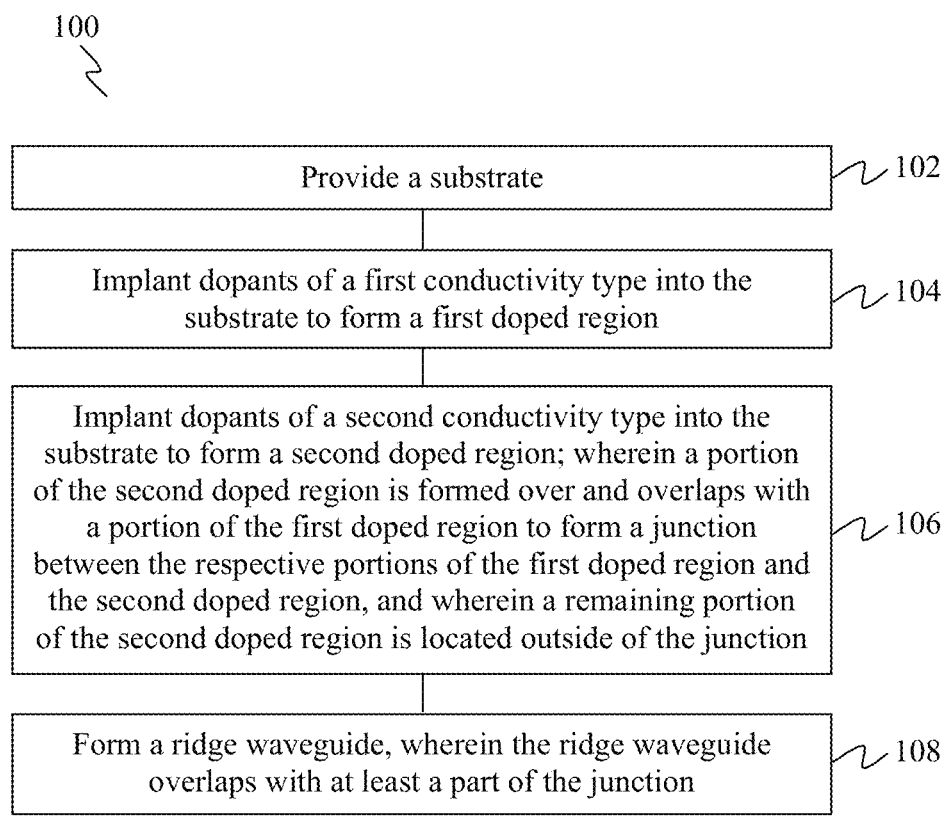
FIG. 1 shows a flow chart illustrating a method for forming an optical modulator, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may relate to fields including silicon (Si) photonics (e.g. Si nano/micro-photonics), optical communication system, and data center/on-chip optical interconnect.

Various embodiments may provide a silicon (Si) based optical modulator.

Various embodiments may provide an optical modulator using a vertical PN diode in silicon, which may facilitate high-speed and low-power operation. Unlike other existing devices, the vertical PN diode is of a simple structure, thus simplifying the fabrication process. The vertical PN design may also enhance interaction between the optical field and the electron free-carrier, thus increasing the modulation efficiency. As a non-limiting example, the optical modulator of various embodiments may have a modulation speed or switching speed that is larger than about 40 GHz (from simulation result), with a modulation efficiency ($V_\pi L_\pi$) of only about 1.66 V·cm at about 3.5 V DC bias (Vpp is only about 0.5 V, which is well below the CMOS-Operating Voltage, therefore easy for the driver). For the modulation efficiency, $V_\pi$ refers to the applied voltage under which a $\pi$ shift may be realized within a given length of the optical modulator, while $L_\pi$ refers to the length of the optical modulator under which a $\pi$ shift may be realized for a given applied voltage.

Various embodiments may provide an approach to increase the operation speed (modulation speed) of a silicon optical modulator. Various embodiments may provide an approach to fabricate a silicon modulator by using a simple process and to provide a large tolerance during the fabrication process.

Various embodiments may provide one or more of the following: (1) a PN junction in an optical waveguide for a silicon optical modulator; (2) implantation scheme(s) for forming a PN junction in an optical waveguide for a silicon optical modulator; (3) a cost effective modulator; (4) a simple fabrication process; or (5) planar integration, with CMOS compatible fabrication.

FIG. 1 shows a flow chart 100 illustrating a method for forming an optical modulator, according to various embodiments.

At 102, a substrate is provided.

In various embodiments, the substrate may be a semiconductor substrate. As a non-limiting example, the substrate may include silicon (Si), e.g. a silicon (Si) substrate or a silicon-on-insulator (SOI) substrate.

At 104, dopants of a first conductivity type are implanted into the substrate to form a first doped region.

At 106, dopants of a second conductivity type are implanted into the substrate to form a second doped region, wherein a portion of the second doped region is formed over and overlaps with a portion of the first doped region to form a junction between the respective portions of the first doped region and the second doped region, and wherein a remaining portion of the second doped region is located outside of the junction. This may mean that only a portion of the second doped region may be formed overlapping with only a portion of the first doped region to form the junction. In other words, the first doped region and the second doped region may not entirely overlap with each other.

In various embodiments, the portion of the second doped region may be formed on top of the portion of the first doped region. In various embodiments, the overlapping portions of the first doped region and the second doped region may be in contact with each other.

At 108, a ridge waveguide is formed, wherein the ridge waveguide overlaps with at least a part of the junction.

In various embodiments, the ridge waveguide may be formed on top of the respective portions of the first doped region and the second doped region overlapping with each other. In various embodiments, the ridge waveguide may be formed overlapping with at least a part of the overlapping portions of the first doped region and the second doped region. This may mean that the remaining portion of the second doped region may not overlap with the ridge waveguide. In various embodiments, the ridge waveguide may be formed overlapping with the entire junction. The ridge waveguide may be undoped.

In the context of various embodiments, material may be removed, for example by etching, from the substrate to form the ridge waveguide.

In the context of various embodiments, material may be removed, for example by etching, from the second doped region to form the ridge waveguide. Therefore, a part of the second doped region may be contained within the ridge waveguide.

In the context of various embodiments, a ridge structure may be deposited to form the ridge waveguide. In various embodiments, the ridge structure may include silicon nitride (SiN).

In various embodiments, the first conductivity type and the second conductivity type may be opposite conductivity types. In the context of various embodiments, the first conductivity type may be an N-type conductivity type, while the second conductivity type may be a P-type conductivity type.

In the context of various embodiments, the term "N-type" may mean a semiconductor with an excess number of mobile electrons. Accordingly, a region having N-type dopants may mean a region of a host material (generally a semiconductor) that is doped with dopant atoms that may provide extra conduction electrons to the host material, thereby resulting in an electrically conductive N-type semiconductor with an excess number of mobile electrons (negatively charged carriers). Such dopants are also generally referred to as donors. In the context of various embodiments, the N-type dopants or donor dopants may be selected from the group consisting of phosphorus (P), arsenic (As) and antimony (Sb).

In the context of various embodiments, the term "P-type" may mean a semiconductor with an excess of mobile holes. Accordingly, a region having P-type dopants may mean a region of a host material (generally a semiconductor) that is doped with dopant atoms that may accept weakly-bound outer electrons from the host material, thereby creating vacancies left behind by the electrons, known as holes. This results in an electrically conductive P-type semiconductor with an excess number of mobile holes (positively charged carriers). Such dopants are also generally referred to as acceptors. In the context of various embodiments, the P-type dopants or acceptor dopants may be selected from the group consisting of boron (B), aluminium (Al), gallium (Ga) and indium (In).

In the context of various embodiments, the host material may include silicon (Si), which is a Group IV element. A region of the Si host material may be implanted with Group III dopants or elements, for example boron (B), to form a P-type Si region. A region of the Si host material may be implanted with Group V dopants or elements, for example phosphorus (P), to form an N-type Si region.

In various embodiments, the junction may be formed at the boundary between the portion of the first doped region and the portion of the second doped region. For example, a junction of opposite type conductivity types (e.g. N-type and P-type conductivity types) may be formed at the boundary between the overlapping portions of the first doped region and the second doped region.

In various embodiments, the first doped region may be a layer of the first conductivity type, while the second doped region may be a layer of the second conductivity type.

In various embodiments, the first doped region and the second doped region may be formed in an epitaxial layer of the substrate (e.g. the epitaxial silicon (Si) layer of an SOI substrate or wafer, i.e. the Si layer above the buried oxide (BOX) layer of the SOI substrate).

In various embodiments, as the portion of the second doped region may be formed over the portion of the first doped region, the respective portions of the first doped region and the second doped region overlapping with each other may be formed coaxially in the vertical direction. This may mean that the overlapping portions forming the junction may be arranged adjacent to each other, side by side (e.g. in a stack arrangement) in a thickness direction of the substrate. Therefore, the overlapping portions of the first doped region having dopants of the first conductivity type and the second doped region having dopants of the second conductivity type may form a vertical diode.

In various embodiments, the first doped region and the second doped region may be horizontally displaced relative to each other.

In various embodiments, a remaining portion of the first doped region may be located outside of the junction.

In various embodiments, the remaining portion of the second doped region may be formed over an undoped region of the substrate, for example an intrinsic region of the substrate.

In the context of various embodiments, the terms "undoped region" and "intrinsic region" may mean a region of the substrate or host material, without the presence of any significant dopant elements or atoms (i.e. free of other elements or having minimal traces of other elements or non-intentional elements).

In various embodiments, the first doped region of the first conductivity type may be formed in or within the substrate in a single implantation step or process in the form of a first implantation step.

In various embodiments, the second doped region of the second conductivity type may be formed in or within the substrate in a single implantation step or process in the form of a second implantation step.

In various embodiments, implanting dopants of the first conductivity type into the substrate to form the first doped region and implanting dopants of the second conductivity type into the substrate to form the second doped region may be different or individual implantation steps.

In various embodiments, any sequence for forming the first doped region and forming the second doped region may be carried out. For example, the second doped region may be formed after forming the first doped region. Alternatively, the second doped region may be formed before forming the first doped region.

In various embodiments, the first doped region, the second doped region and the ridge waveguide may be formed in any sequence. For example, the sequence may include (i) forming the first doped region, the second doped region, and the ridge waveguide, or (ii) forming the first doped region, the ridge waveguide and the second doped region, or (iii) forming the second doped region, the first doped region, and the ridge waveguide, or (iv) forming the second doped region, the ridge waveguide and the first doped region, or (v) forming the ridge waveguide, the first doped region and the second doped region, or (vi) forming the ridge waveguide, the second doped region and the first doped region.

In various embodiments, the ridge waveguide may be formed after forming the first doped region and the second doped region. This may simplify the fabrication process. Further, by forming the first doped region and the second doped region prior to forming the ridge waveguide, the first doped region and the second doped region may be formed as respective layers or planar regions.

In various embodiments, prior to forming the first doped region, the method may include forming a first masking layer over the substrate (e.g. on a surface of the substrate). Dopants of the first conductivity type may then be implanted into the substrate through an opening formed in the first masking layer to form the first doped region. The first masking layer may then be removed.

In various embodiments, prior to forming the second doped region, the method may include forming a second masking layer over the substrate (e.g. on a surface of the substrate). Dopants of the second conductivity type may then be implanted into the substrate through an opening formed in the second masking layer to form the second doped region. The second masking layer may then be removed.

In various embodiments, at least one of the first and second doped regions is a buried region.

In various embodiments, at least one of a concentration of the dopants of the first conductivity type at the first doped region or a concentration of the dopants of the second conductivity type at the second doped region may be between about $1 \times 10^{17}/cm^3$ (i.e. $1 \times 10^{17}$ $cm^{-3}$) and about $1 \times 10^{18}/cm^3$, for example between about $1 \times 10^{17}/cm^3$ and about $5 \times 10^{17}/cm^3$, between about $5 \times 10^{17}/cm^3$ and about $1 \times 10^{18}/cm^3$, or between about $2 \times 10^{17}/cm^3$ and about $6 \times 10^{17}/cm^3$.

In various embodiments, the concentration of the dopants of the first conductivity type at the first doped region may be at least substantially equal to the concentration of the dopants of the second conductivity type at the second doped region.

In various embodiments, implantation of dopants of the first conductivity type into the substrate to form the first doped region may be carried out at a first energy value, and implantation of dopants of the second conductivity type into the substrate to form the second doped region may be carried out at a second energy value that is lower than the first energy value. As a non-limiting example, implantation of the dopants of the first conductivity type into the substrate to form the first doped region may be carried out in a high energy implantation process, while implantation of the dopants of the second conductivity type into the substrate to form the second doped region may be carried out in a low energy implantation process.

As the implantation depth of dopants in the substrate may depend on the energy value employed, varying the energy values may control the implantation depth of dopants into the substrate. For example, a higher energy value may enable dopants to be implanted deeper into the substrate. Therefore, by implanting dopants of the second conductivity type at an energy value lower than that for implanting dopants of the first conductivity type, the second doped region may be formed less deep into the substrate compared to the first doped region.

In the context of various embodiments, the first energy value may be between about 10 keV and about 200 keV, for example between about 10 keV and about 100 keV, between about 10 keV and about 50 keV, between about 50 keV and about 200 keV, or between about 50 keV and about 100 keV.

In the context of various embodiments, the second energy value may be between about 10 keV and about 200 keV, for example between about 10 keV and about 100 keV, between about 10 keV and about 50 keV, between about 50 keV and about 200 keV, or between about 50 keV and about 100 keV.

In various embodiments, the method may further include implanting dopants of the first conductivity type into the substrate to form a first contact region adjacent to the first doped region.

In various embodiments, the first contact region may be in contact with the first doped region. The first contact region may not be in contact with the second doped region, for example there may be an undoped region of the substrate between the first contact region and the second doped region.

In various embodiments, the first contact region may be formed towards one side of the substrate. The first contact region may be formed adjacent to an end region of the first doped region that is away from the junction.

In various embodiments, the concentration of the dopants of the first conductivity type at the first contact region may be higher than the concentration of the dopants of the first conductivity type at the first doped region.

In various embodiments, the concentration of the dopants of the first conductivity type at the first contact region may be between about $1 \times 10^{20}/cm^3$ and about $1 \times 10^{21}/cm^3$, for example between about $1 \times 10^{20}/cm^3$ and about $5 \times 10^{20}/cm^3$, between about $5 \times 10^{20}/cm^3$ and about $1 \times 10^{21}/cm^3$, or between about $2 \times 10^{20}/cm^3$ and about $6 \times 10^{20}/cm^3$.

In various embodiments, the first contact region may provide an Ohmic contact.

In various embodiments, implantation of dopants of the first conductivity type into the substrate to form the first contact region may be carried out at an energy value between about 10 keV and about 200 keV, for example between about 10 keV and about 100 keV, between about 10 keV and about 50 keV, between about 50 keV and about 200 keV, or between about 50 keV and about 100 keV.

In various embodiments, the first contact region of the first conductivity type may be formed in or within the substrate in a single implantation step or process in the form of a third implantation step.

In various embodiments, implanting dopants of the first conductivity type into the substrate to form the first doped region, implanting dopants of the second conductivity type into the substrate to form the second doped region and implanting dopants of the first conductivity type into the substrate to form the first contact region may be different or individual implantation steps. In various embodiments, the first contact region may be formed after forming the first doped region. In various embodiments, the first contact region may be formed after forming the first doped region and the second doped region.

In various embodiments, the ridge waveguide may be formed after forming the first doped region, the second doped region and the first contact region.

In various embodiments, prior to forming the first contact region, the method may include forming a third masking layer over the substrate (e.g. on a surface of the substrate). Dopants of the first conductivity type may then be implanted into the substrate through an opening formed in the third masking layer to form the first contact region. The third masking layer may then be removed.

The method may further include forming a first metal layer over the first contact region, for example in contact with the first contact region. The first metal layer may include but not limited to aluminum (Al), copper (Cu), gold (Au), tungsten (W), or titanium (Ti).

In various embodiments, the method may further include implanting dopants of the second conductivity type into the substrate to form a second contact region adjacent to the second doped region.

In various embodiments, the second contact region may be in contact with the second doped region. The second contact region may not be in contact with the first doped region, for example there may be an undoped region of the substrate between the second contact region and the first doped region.

In various embodiments, the second contact region may be formed towards another side of the substrate opposite to the first contact region. The second contact region may be formed adjacent to an end region of the second doped region that is away from the junction.

In various embodiments, the concentration of the dopants of the second conductivity type at the second contact region may be higher than the concentration of the dopants of the second conductivity type at the second doped region.

In various embodiments, the concentration of the dopants of the second conductivity type at the second contact region may be between about $1 \times 10^{20}/cm^3$ and about $1 \times 10^{21}/cm^3$, for example between about $1 \times 10^{20}/cm^3$ and about $5 \times 10^{20}/cm^3$, between about $5 \times 10^{20}/cm^3$ and about $1 \times 10^{21}/cm^3$, or between about $2 \times 10^{20}/cm^3$ and about $6 \times 10^{20}/cm^3$.

In various embodiments, the concentration of the dopants of the first conductivity type at the first contact region may be at least substantially equal to the concentration of the dopants of the second conductivity type at the second contact region.

In various embodiments, the second contact region may provide an Ohmic contact.

In various embodiments, implantation of dopants of the second conductivity type into the substrate to form the second contact region may be carried out at an energy value between about 10 keV and about 200 keV, for example between about 10 keV and about 100 keV, between about 10 keV and about 50 keV, between about 50 keV and about 200 keV, or between about 50 keV and about 100 keV.

In various embodiments, implantations of the respective dopants for forming the first contact region and the second contact region may be performed at respective energy values that are at least substantially the same.

In various embodiments, the second contact region of the second conductivity type may be formed in or within the substrate in a single implantation step or process in the form of a fourth implantation step.

In various embodiments, implanting dopants of the first conductivity type into the substrate to form the first doped region, implanting dopants of the second conductivity type into the substrate to form the second doped region, implanting dopants of the first conductivity type into the substrate to form the first contact region and implanting dopants of the second conductivity type into the substrate to form the second contact region may be different or individual implantation steps. In various embodiments, the second contact region may be formed after forming the second doped region. In various embodiments, the second contact region may be formed after forming the first doped region, the second doped region and the first contact region.

In various embodiments, the ridge waveguide may be formed after forming the first doped region, the second doped region, the first contact region and the second contact region.

In various embodiments, prior to forming the second contact region, the method may include forming a fourth masking layer over the substrate (e.g. on a surface of the substrate). Dopants of the second conductivity type may then be implanted into the substrate through an opening formed in the fourth masking layer to form the second contact region. The fourth masking layer may then be removed.

The method may further include forming a second metal layer over the second contact region, for example in contact with the second contact region. The second metal layer may include but not limited to aluminium (Al), copper (Cu), gold (Au), tungsten (W), or titanium (Ti).

In various embodiments, the method may further include implanting dopants of the first conductivity type into the substrate to form a third doped region, wherein the third doped region may be formed over the first doped region, and wherein the portion of the second doped region may be formed beneath and overlaps with a portion of the third doped region to form another junction between the respective portions of the third doped region and the second doped region. This may mean that only a portion of the second doped region may be formed overlapping with only a portion of the third doped region to form the other junction. In other words, the third doped region and the second doped region may not entirely overlap with each other.

In various embodiments, the first doped region and the third doped region may be formed in or within the substrate in a single implantation step or process in the form of a first implantation step. For example, during the first implantation step, dopants of the first conductivity type may be implanted at two different regions, for example by varying (for example increasing or decreasing) the energy values used for the respective implantations to form the first doped region and the third doped region. For example, a lower doped region may be formed and the energy value used may then be decreased to form an upper doped region above the lower doped region, or an upper doped region may be formed and the energy value used may then be increased to form a lower doped region below the upper doped region. The lower doped region may be the first doped region and the upper doped region may be third doped region.

In various embodiments, implantation of dopants of the first conductivity type into the substrate to form the third doped region may be carried out at a third energy value that is lower than each of the first energy value and the second energy value.

In various embodiments, implantation of dopants of the first conductivity type into the substrate to form the third doped region may be carried out at an energy value between about 10 keV and about 200 keV, for example between about 10 keV and about 100 keV, between about 10 keV and about 50 keV, between about 50 keV and about 200 keV, or between about 50 keV and about 100 keV.

In various embodiments, the concentration of the dopants of the first conductivity type at the third doped region may be between about $1\times10^{17}/cm^3$ and about $1\times10^{18}/cm^3$, for example between about $1\times10^{17}/cm^3$ and about $5\times10^{17}/cm^3$, between about $5\times10^{17}/cm^3$ and about $1\times10^{18}/cm^3$, or between about $2\times10^{17}/cm^3$ and about $6\times10^{17}/cm^3$.

In various embodiments, the concentration of the dopants of the first conductivity type at the first doped region may be at least substantially equal to the concentration of the dopants of the first conductivity type at the third doped region.

In various embodiments, the third doped region may be a buried region.

In various embodiments, the entire third doped region may overlap with the entire first doped region.

In various embodiments, the portion of the third doped region may be formed on top of the portion of the second doped region. In various embodiments, the overlapping portions of the third doped region and the second doped region may be in contact with each other.

In various embodiments, the portion of the second doped region may be arranged in between the respective portions of the first doped region and the third doped region.

In various embodiments, the ridge waveguide may be formed after forming the first doped region and the third doped region. In various embodiments, the ridge waveguide may be formed after forming the first doped region, the second doped region and the third doped region.

In various embodiments, the ridge waveguide may be formed overlapping with at least a part of the other junction. The ridge waveguide may be formed on top of the respective portions of the third doped region and the second doped region overlapping with each other. In various embodiments, the ridge waveguide may be formed overlapping with at least a part of the overlapping portions of the third doped region and the second doped region. In various embodiments, the ridge waveguide may be formed overlapping with the other junction entirely.

In various embodiments, material may be removed, for example by etching, from the third doped region to form the ridge waveguide. Therefore, a part of the third doped region may be contained within the ridge waveguide.

In various embodiments, the other junction may be formed at the boundary between the portion of the third doped region and the portion of the second doped region. For example, a junction of opposite type conductivity types (e.g. N-type and P-type conductivity types) may be formed at the boundary between the third doped region and the second doped region.

In various embodiments, the third doped region may be a layer of the first conductivity type.

In various embodiments, the third doped region may be formed in an epitaxial layer of the substrate (e.g. the epitaxial silicon (Si) layer of an SOI substrate or wafer, i.e. the Si layer above the buried oxide (BOX) of the SOI substrate).

In various embodiments, as the portion of the third doped region may be formed over the portion of the second doped region, the respective portions of the third doped region and the second doped region overlapping with each other may be formed coaxially in the vertical direction. This may mean that the overlapping portions forming the other junction may be arranged adjacent to each other, side by side (e.g. in a stack arrangement) in a thickness direction of the substrate. Therefore, the overlapping portions of the third doped region having dopants of the first conductivity type and the second doped region having dopants of the second conductivity type may form a vertical diode.

In various embodiments, the third doped region and the second doped region may be horizontally displaced relative to each other.

In various embodiments, a remaining portion of the third doped region as well as the remaining portion of the second doped region may be located outside of the other junction.

In various embodiments, prior to forming the first doped region and the third doped region, the method may include forming a first masking layer over the substrate (e.g. on a surface of the substrate). Dopants of the first conductivity type may then be implanted into the substrate through an opening formed in the first masking layer to form the first doped region and the third doped region. The first masking layer may then be removed.

In various embodiments, by forming the junction between the overlapping portions of the first doped region and the second doped region, and the other junction between the overlapping portions of the third doped region and the second doped region, two junctions may be formed. Accordingly, the overlapping portions of the first doped region and the second doped region may form a diode, and the overlapping portions of the third doped region and the second doped region may form another diode, such that back to back diodes may be formed.

In various embodiments, at the time of forming the first doped region (e.g. during a first implantation step) an energy value used for implanting dopants of the first conductivity type into the substrate may be changed to form the first doped region across a thickness of the substrate, wherein the portion of the second doped region may be formed partially within the first doped region. The first doped region may be formed throughout the entire thickness of the substrate. As a non-limiting example, the energy value may be increased or decreased. In various embodiments, the energy value used may be decreased to progressively form the first doped region in decreasing depth of the substrate, or the energy value used may be increased to progressively form the first doped region in increasing depth of the substrate. The energy value may be gradually changed or step-wise changed. In various embodiments, the portion of the second doped region may be in contact with the first doped region. In various embodiments, the first doped region may be a continuous region. In various embodiments, the first doped region may be formed up to the upper surface of the substrate.

In various embodiments, by forming portion of the second doped region partially within the first doped region, the portion of the second doped region may be formed in between an upper portion of the first doped region and a lower portion of the first doped region. This may mean that the portion of the second doped region within the first doped region may overlap with the upper portion and the lower portion of the first doped region. In this arrangement, a junction may be formed between the portion of the second doped region overlapping with the lower portion of the first doped region, and another junction may be formed between the portion of the second doped region overlapping with the upper portion of the first doped region. Accordingly, the lower portion of the first doped region and the portion of the second doped region overlapping each other may form a diode, and the upper portion of the first doped region and the portion of the second doped region overlapping each other may form another diode, such that back to back diodes may be formed.

In various embodiments, the ridge waveguide may be formed overlapping with at least a part of the junction and at least a part of the other junction. The ridge waveguide may be formed on top of the respective portions of the first doped region and the second doped region overlapping with each other. In various embodiments, the ridge waveguide may be formed overlapping with at least one of the junction entirely or the other junction entirely.

In various embodiments, material may be removed, for example by etching, from the first doped region to form the ridge waveguide. Therefore, a part of the first doped region may be contained within the ridge waveguide.

In the context of various embodiments, the width of the ridge waveguide may be between about 400 nm and about 1000 nm, for example between about 400 nm and about 800 nm, between about 400 nm and about 600 nm, between about 600 nm and about 1000 nm, or between about 500 nm and about 700 nm.

In the context of various embodiments, the height of at least one of the first contact region or the second contact region may be between about 50 nm and about 500 nm, for example between about 50 nm and about 300 nm, between about 50 nm and about 200 nm, between about 50 nm and about 100 nm, between about 100 nm and about 500 nm, between about 300 nm and about 500 nm, or between about 100 nm and about 200 nm.

In the context of various embodiments, the distance between the ridge waveguide and at least one of the first contact region or the second contact region may be between about 0.5 µm and about 1 µm, for example between about 0.5 µm and about 0.8 µm, between about 0.5 µm and about 0.6 µm, or between about 0.7 µm and about 1 µm.

In the context of various embodiments, the thickness of at least one of the first doped region or the second doped region may be between 20 nm and about 300 nm, for example between 20 nm and about 200 nm, between 20 nm and about 100 nm, between 20 nm and about 50 nm, between 50 nm and about 300 nm, between 100 nm and about 300 nm, or between 100 nm and about 200 nm.

In the context of various embodiments, at least one of the first doped region, the second doped region or the third doped region may be formed as a layer or a planar region.

In the context of various embodiments, implantation of dopants of the first conductivity type and dopants of the second conductivity type may be performed using ion implantation processes.

In the context of various embodiments, any one of or each of the first masking layer, the second masking layer, the third masking layer or the fourth masking layer may be a resist layer (e.g. a photoresist layer).

Various embodiments may employ a vertical PN diode in an optical device (e.g. optical modulator) in order to enhance the modulation speed. The vertical PN structure of various embodiments may allow for a simplified fabrication process, where the relatively simple implantation/doping schemes employed in various embodiments simplify the fabrication process and enable a wide fabrication tolerance. The vertical PN design may also enhance the interaction between the optical field and the electron free-carrier, thus increasing the modulation efficiency. In other words, various embodiments may provide enhanced interaction between the optical mode field and the free-carrier dispersion region (optical mode), thereby providing an enhanced modulation efficiency. The simulated modulation speed of the optical modulator of various embodiments may be larger than about 40 Gb/s, with $V_\pi L_\pi$ of about 1.66 V·cm at about 3.5V DC bias. Therefore, the use of a vertical PN junction may ensure a high-speed operation.

Various embodiments may provide a silicon (Si) ridge waveguide-based optical modulator, which may be made of or may include a PN junction. The PN junction may include P type and N type regions located in a vertical direction (arranged one over the other) inside the ridge waveguide. The optical modulator may also include $P^+$ and $N^+$ contact regions that may be located laterally outside the ridge waveguide. In various embodiments, the ridge waveguide may be an etched silicon, meaning a silicon material that may be etched to form the ridge waveguide, or other deposited materials, such as silicon nitride (SiN) to form the ridge waveguide.

Figure 2A:
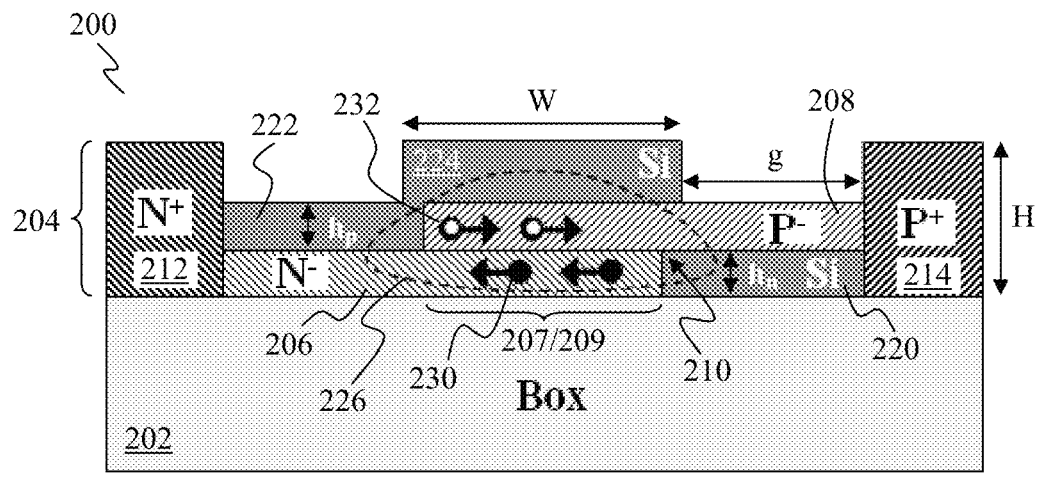
FIG. 2A shows a schematic cross sectional view of an optical modulator, according to various embodiments.

FIG. 2A shows a schematic cross sectional view of an optical modulator 200, according to various embodiments. The optical modulator 200 may employ a vertical PN diode for a high-speed low-power optical modulator.

The optical modulator 200 may be fabricated using a silicon-on-insulator (SOI) wafer having a buried oxide (BOX) layer 202 and a silicon (Si) layer 204 (e.g. an epitaxial silicon layer of the SOI wafer) on top of the BOX layer 202. The optical modulator 200 may include an N⁻ doped region (e.g. lightly N-doped region) 206 formed on the BOX layer 202. The N⁻ doped region 206 may for example be a first doped region. The N⁻ doped region 206 may be a buried region. The N⁻ doped region 206 may be in contact with the BOX layer 202. The optical modulator 200 may further include a P⁻ doped region (e.g. lightly P-doped region) 208 formed on or over the N⁻ doped region 206. The P⁻ doped region 208 may for example be a second doped region. The P⁻ doped region 208 may be a buried region. A portion 209 of the P⁻ doped region 208 may be formed overlapping with a portion 207 of the N⁻ doped region 206, for example the respective portions 207, 209 may be in contact with each other, to form a PN junction 210 between the P⁻ doped region 208 and the N⁻ doped region 206. Therefore, the respective overlapping portions 207, 209 of the N⁻ doped region 206 and the P⁻ doped region 208 may form a PN diode. A remaining non-overlapping portion of the P⁻ doped region 208 outside of the PN junction 210 may be formed over an intrinsic Si region 220 of the Si layer 204. As shown in FIG. 2A, each of the N⁻ doped region 206 and the P⁻ doped region 208 may be a planar region.

The PN diode formed by the overlapping portions 207, 209, and having the vertical PN junction 210, is a vertical diode where the respective overlapping portions 207, 209 of the N⁻ doped region 206 and the P⁻ doped region 208 are arranged adjacent to each other, side by side in a vertical direction or in a thickness direction of the layer 204.

The optical modulator 200 may further include an N⁺ contact region (e.g. heavily N-doped contact region) 212 in contact with the N⁻ doped region 206. The N⁺ contact region 212 may be formed adjacent to the N⁻ doped region 206 at one end region of the N⁻ doped region 206 away from the PN junction 210. The optical modulator 200 may further include a P⁺ contact region (e.g. heavily P-doped contact region) 214 in contact with the P⁻ doped region 208. The P⁺ contact region 214 may be formed adjacent to the P⁻ doped region 208 at one end region of the P⁻ doped region 208 away from the PN junction 210. Each of the N⁺ contact region 212 and the P⁺ contact region 214 may have a height, H.

The intrinsic Si region 220 of the Si layer 204 may separate the N⁻ doped region 206 from the P⁺ contact region 214. The intrinsic Si region 220 and the N⁻ doped region 206 may have a height, $h_n$. An intrinsic Si region 222 of the Si layer 204 may separate the P⁻ doped region 208 from the N⁺ contact region 212. The intrinsic Si region 222 and the P⁻ doped region 208 may have a height, $h_p$.

The optical modulator 200 may further include a ridge or rib waveguide 224 formed overlapping with the PN junction 210, for example overlap with the entire PN junction 210. The ridge waveguide 224 may be formed over the N⁻ doped region 206 and the P⁻ doped region 208. The ridge waveguide 224 may be an intrinsic Si region of the layer 204. The ridge waveguide 224 may be formed by removing material from the portion of the layer 204 above the P⁻ doped region 208, for example by etching. The ridge waveguide 224 may have a width, W. The ridge waveguide 224 may be spaced from the P⁺ contact region 214 by a distance, g. Similarly, the ridge waveguide 224 may be spaced from the N⁺ contact region 212 by a distance, g.

The ridge waveguide 224 may provide a confinement or guiding effect on an optical signal or optical mode propagating through the optical modulator 200. The closed dashed loop 226 represents the mode field of the optical signal that may propagate through the optical modulator 200. The mode field 226 may overlap with the respective overlapping portions 207, 209 of the N⁻ doped region 206 and the P⁻ doped region 208, as well as overlap with the PN junction 210.

In operation, for example by reverse biasing the PN junction 210, electrons, as represented by 230, from the N⁻ doped region 206 may flow away from the PN junction 210 towards the N⁺ contact region 212, while holes, as represented by 232, from the P⁻ doped region 208 may flow away from the PN junction 210 towards the P⁺ contact region 214. Therefore, a depletion region may be formed in the vicinity of the PN junction 210 due to depletion of charges.

In contrast to lateral or horizontal PN structures for conventional optical modulators, the optical modulators of various embodiments, including the optical modulator 200, employ a vertical PN diode in order to provide an enhanced modulation speed due to a decreased resistance and capacitance time constant (RC delay). Furthermore, the vertical PN diode of various embodiments may be formed by only four steps of implantation, including low dose, optimized energy implantations for the vertical PN diode, and high dose, high energy implantations for the Ohmic contact or contact regions.

As shown in FIG. 2A, there may be an overlap between the optical waveguide field 226 and the vertical PN diode. The stronger the interaction between the optical waveguide field 226 and the free-carrier change region (see above), the higher the modulation efficiency may be for the optical modulator 200. In various embodiments, the optical waveguide field 226 may overlap with the vertical PN diode, which may potentially provide a high modulation efficiency.

Figure 2B:
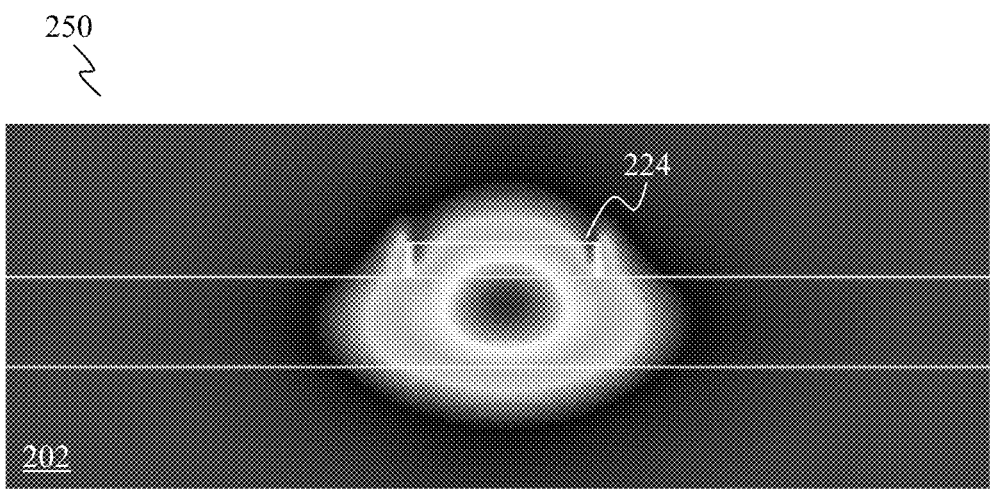
FIG. 2B shows a plot of simulated waveguide mode field distribution of the optical modulator of the embodiment of FIG. 2A.

FIG. 2B shows a plot 250 of simulated waveguide mode field distribution of the optical modulator 200 of the embodiment of FIG. 2A, illustrating the transverse electric (TE) mode distribution. FIG. 2B further shows the coupling effect of the optical modulator 200 with photons. For the simulation, the parameters are W=600 nm, H=220 nm, $h_p=h_n=70$ nm, g=900 nm. Further, the concentrations of the respective dopants in the N⁻ doped region 206 and the P⁻ doped region 208 respectively may be about 5.0e17 cm⁻³. The effective refractive index, $n_{eff}$(TE), may be about 2.758.

Figure 2C:
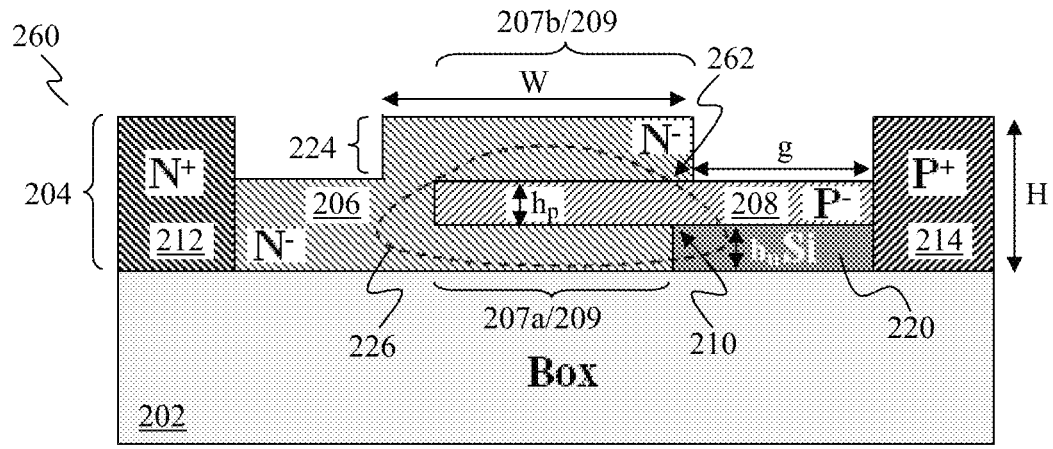
FIG. 2C to 2E show schematic cross sectional views of respective optical modulators, according to various embodiments.
Figure 2D:
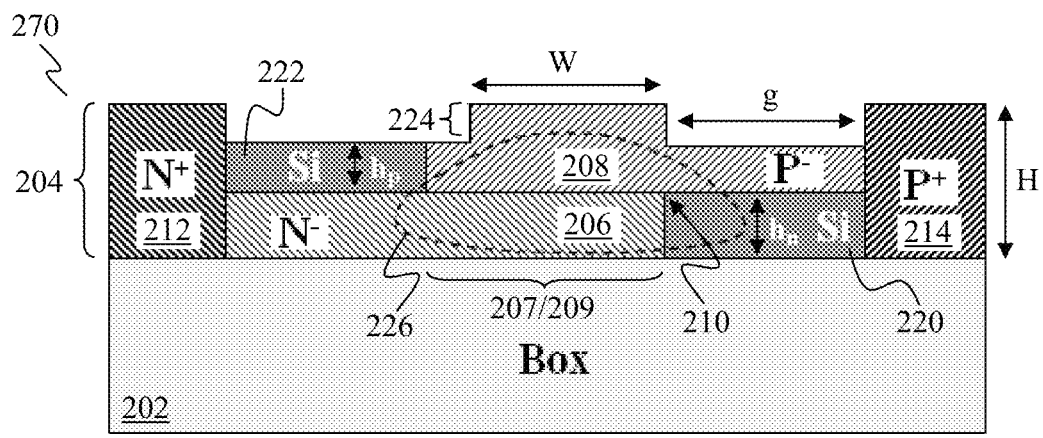
Figure 2E:
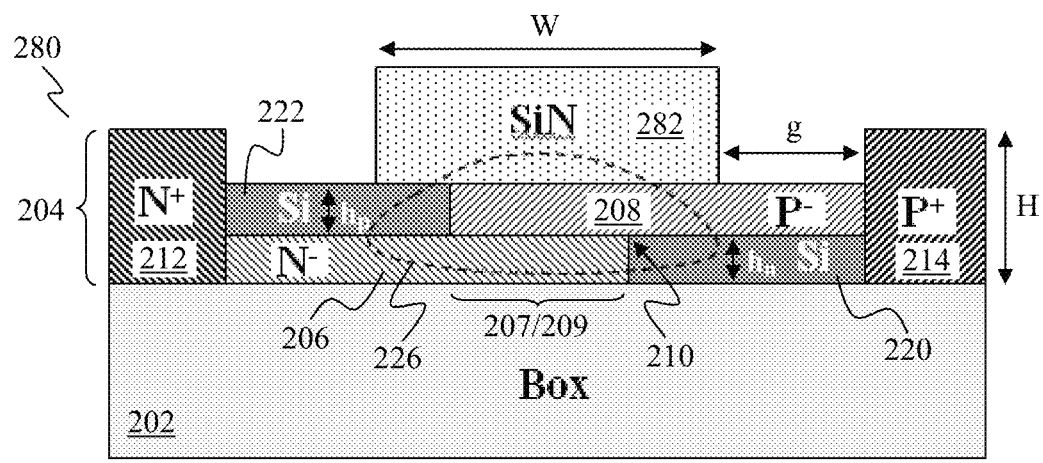

FIG. 2C to 2E show schematic cross sectional views of respective optical modulators 260, 270, 280, according to various embodiments. Referring to FIG. 2C, the optical modulator 260 may be as described in the context of the optical modulator 200, except that the N⁻ doped region 206 may be formed extending across, for example throughout, the thickness of the layer 204. This may mean that the N⁻ doped region 206 may extend from a lower surface of the layer 204 adjacent to the BOX layer 202 to an upper surface of the layer 204. A portion 209 of the P⁻ doped region 208 may be formed extending partially into the N⁻ doped region 206 and in contact with the N⁻ doped region 206. As shown in FIG. 2C, the portion 209 of the P⁻ doped region 208 within the N⁻ doped region 206 may be sandwiched between a lower portion 207a of the N⁻ doped region 206 and an upper portion 207b of the N⁻ doped region 206. A PN junction 210 may be formed between the portion 209 of the P⁻ doped region 208 overlapping with the lower portion 207a of the N⁻ doped region 206, and another PN junction 262 may be formed between the portion 209 of the P⁻ doped region 208 overlapping with the upper portion 207b of the N⁻ doped region 206. Therefore, an NPN arrangement may be formed in the vertical direction, with two vertical PN diodes back to back. The ridge waveguide 224 may be formed by removing material from the N⁻ doped region 206, for example by etching. Therefore, the ridge waveguide 224 may contain the N⁻ doped region 206, for example the upper portion 207b of the N⁻ doped region 206. The ridge waveguide 224 may overlap with the entire PN junction 210 and the entire PN junction 262.

Referring to FIG. 2D, the optical modulator 270 may be as described in the context of the optical modulator 200, except that the P⁻ doped region 208 may be formed extending up to an upper surface of the layer 204. The ridge waveguide 224 may be formed by removing material from the P⁻ doped region 208, for example by etching. Therefore, the ridge waveguide 224 may contain the P⁻ doped region 208. The ridge waveguide 224 may overlap with a part of the PN junction 210.

Referring to FIG. 2E, the optical modulator 280 may be as described in the context of the optical modulator 200, except that a ridge structure 282, e.g. a silicon nitride (SiN) ridge structure, may be deposited over the N⁻ doped region 206 and the P⁻ doped region 208, to form a ridge waveguide. The ridge structure 282 may overlap with the entire PN junction 210.

FIGS. 3A to 3F show, as cross-sectional views, various processing stages of a method for forming an optical modulator, according to various embodiments, illustrating a fabrication process flow to form a vertical PN diode in a silicon-on-insulator (SOI) substrate.

Referring to FIG. 3A, a silicon-on-insulator (SOI) substrate 380 may be provided, the SOI substrate 380 having a buried oxide (BOX) layer 302 and a silicon layer 304 over the BOX layer 302.

Referring to FIG. 3B, a first masking layer 382 may be formed over the Si layer 304 and patterned to provide an opening 384. During a first implantation step, a low dose or concentration of about $1 \times 10^{18}/cm^3$ of N-type dopants may be implanted into the Si layer 304 through the opening 384 at a high energy of about 130 keV to form an N⁻ doped region 306 (e.g. lightly N-doped region) 306. The first masking layer 382 may then be removed. The N⁻ doped region 306 may for example be a first doped region. The N⁻ doped region 306 may be a buried region. The N⁻ doped region 306 may be formed towards the lower surface of the Si layer 304 adjacent to the BOX layer 302. As shown in FIG. 3B, the N⁻ doped region 306 may be formed as a planar region.

Referring to FIG. 3C, a second masking layer 386 may be formed over the Si layer 304 and patterned to provide an opening 388. During a second implantation step, a low dose or concentration of about $1 \times 10^{18}/cm^3$ of P-type dopants may be implanted into the Si layer 304 through the opening 388 at a low or moderate energy of about 27 keV to form a P⁻ doped region (e.g. lightly P-doped region) 308. The second masking layer 386 may then be removed.

The P⁻ doped region 308 may for example be a second doped region. The P⁻ doped region 308 may be a buried region. As shown in FIG. 3C, the P⁻ doped region 308 may be formed as a planar region. The P⁻ doped region 308 may be formed over the N⁻ doped region 306 where a portion 307 of the N⁻ doped region 306 may overlap with a portion 309 of the P⁻ doped region 308, in contact with each other, to form a PN junction 310 between the overlapping portions 307, 309 of the N⁻ doped region 306 and the P⁻ doped region 308. As the respective overlapping portions 307, 309 of the N⁻ doped region 306 and the P⁻ doped region 308 are arranged adjacent to each other, side by side in a vertical direction or in a thickness direction of the layer 304, the PN diode formed by the overlapping portions 307, 309 is a vertical diode having the vertical PN junction 310. A remaining non-overlapping portion of the P⁻ doped region 308 outside of the PN junction 310 may be formed over an intrinsic Si region 320 of the Si layer 304. There may also be a remaining non-overlapping portion of the N⁻ doped region 306 outside of the PN junction 310.

Referring to FIG. 3D, a third masking layer 390 may be formed over the Si layer 304 and patterned to provide an opening 392. During a third implantation step, a high dose or concentration of about $1 \times 10^{21}/cm^3$ of N-type dopants may be implanted into the Si layer 304 through the opening 392 at a high energy of about 130 keV to form an N⁺ contact region (e.g. heavily N-doped region) 312. The third masking layer 390 may then be removed.

The N⁺ contact region 312 may be formed towards one side of the Si layer 304, adjacent to the N⁻ doped region 306. The N⁺ contact region 312 may be in contact with an end region of the N⁻ doped region 306, away from the PN junction 310. The N⁺ contact region 312 may extend through the entire thickness of the Si layer 304. As shown in FIG. 3D, the N⁺ contact region 312 is spaced apart from the P⁻ doped region 308.

Referring to FIG. 3E, a fourth masking layer 394 may be formed over the Si layer 304 and patterned to provide an opening 396. During a fourth implantation step, a high dose or concentration of about $1 \times 10^{21}/cm^3$ of P-type dopants may be implanted into the Si layer 304 through the opening 396 at a high or moderate energy of about 27 keV to form a P⁺ contact region (e.g. heavily P-doped region) 314. The fourth masking layer 394 may then be removed.

The P⁺ contact region 314 may be formed towards an opposite side of the Si layer 304, adjacent to the P⁻ doped region 308. The P⁺ contact region 314 may be in contact with an end region of the P⁻ doped region 308, away from the PN junction 310. The P⁺ contact region 314 may extend through the entire thickness of the Si layer 304. As shown in FIG. 3E, the P⁺ contact region 314 is spaced apart from the N⁻ doped region 306, with the intrinsic Si region 320 of the Si layer 304 in between.

Referring to FIG. 3F, an etching process may be carried out to etch the Si layer 304, thereby removing material from the Si layer 304 so as to form a Si ridge waveguide 324 over the N⁻ doped region 306 and the P⁻ doped region 308, where the Si ridge waveguide 324 is spaced apart from the N⁺ contact region 312 and the P⁺ contact region 314. The Si ridge waveguide 324 may overlap with the overlapping portions 307, 309 of the N⁺ contact region 312 and the P⁺ contact region 314, and therefore may also overlap with the PN junction 310 as well as the vertical PN diode. Therefore, an optical modulator 300 may be formed.

As shown in FIG. 3F, the intrinsic Si region 320 may separate the N⁻ doped region 306 from the P⁺ contact region 314, while the intrinsic Si region 322 may separate the P⁻ doped region 308 from the N⁺ contact region 312.

FIGS. 4A to 4G show, as cross-sectional views, various processing stages of a method for forming an optical modulator, according to various embodiments, illustrating a fabrication process flow to form a vertical PN diode in a silicon-on-insulator (SOI) substrate.

Referring to FIG. 4A, a silicon-on-insulator (SOI) substrate 480 may be provided, the SOI substrate 480 having a buried oxide (BOX) layer 402 and a silicon layer 404 over the BOX layer 402.

Referring to FIG. 4B, a first masking layer 482 may be formed over the Si layer 404 and patterned to provide an opening 484. During a first implantation step, a low dose or concentration of about $1\times10^{18}/cm^3$ of N-type dopants may be implanted into the Si layer 404 through the opening 484 at a high energy of about 130 keV to form an N⁻ doped region (e.g. lightly N-doped doped region) 406. During the first implantation step, a low dose or concentration of about $1\times10^{18}/cm^3$ of N-type dopants may be implanted into the Si layer 404 through the opening 484 at a low energy of about 27 keV to form another N⁻ doped region (e.g. lightly N-doped region) 450. The first masking layer 482 may then be removed. This may mean that during the first implantation step, the N⁻ doped region 406 may first be formed, and the implantation energy may then be reduced so as to form the N⁻ doped region 450 over the N⁻ doped region 406. As shown in FIG. 4B, the N⁻ doped regions 406, 450 may be formed as planar regions.

The N⁻ doped region 406 may for example be a first doped region. The N⁻ doped region 406 may be a buried region. The N⁻ doped region 406 may be formed towards the lower surface of the Si layer 404 adjacent to the BOX layer 402.

The N⁻ doped region 450 may for example be a third doped region. The N⁻ doped region 450 may be a buried region. The N⁻ doped region 450 may be formed towards the upper surface of the Si layer 404. The entire N⁻ doped region 406 may overlap with the entire N⁻ doped region 450.

Referring to FIG. 4C, a second masking layer 486 may be formed over the Si layer 404 and patterned to provide an opening 488. During a second implantation step, a HI low dose or concentration of about $1\times10^{18}/cm^3$ of P-type dopants may be implanted into the Si layer 404 through the opening 488 at a moderate energy of about 25 keV to form a P⁻ doped region (e.g. lightly P-doped region) 408. The second masking layer 486 may then be removed. The P⁻ doped region 408 may for example be a second doped region. As shown in FIG. 4C, the P⁻ doped region 408 may be formed as a planar region. The P⁻ doped region 408 may be a buried region. The implantation energy value used to form the P⁻ doped region 408 may be in between the implantation energy values used to form the N⁻ doped region 406 and the N⁻ doped region 450 respectively.

As shown in FIG. 4C, the P⁻ doped region 408 may be formed in between the N⁻ doped region 406 and the N⁻ doped region 450. A portion 407 of the N⁻ doped region 406 may overlap with a portion 409 of the P⁻ doped region 408, in contact with each other, to form a PN junction 410 between the overlapping portions 407, 409 of the N⁻ doped region 406 and the P⁻ doped region 408. As the respective overlapping portions 407, 409 of the N⁻ doped region 406 and the P⁻ doped region 408 are arranged adjacent to each other, side by side in a vertical direction or in a thickness direction of the layer 404, the PN diode formed by the overlapping portions 407, 409 is a vertical diode having the vertical PN junction 410. A remaining non-overlapping portion of the P⁻ doped region 408 outside of the PN junction 410 may be formed over an intrinsic Si region 420 of the Si layer 404. There may also be a remaining non-overlapping portion of the N⁻ doped region 406 outside of the PN junction 410.

Further, a portion 452 of the N⁻ doped region 450 may overlap with the portion 409 of the P⁻ doped region 408, in contact with each other, to form another PN junction 462 between the overlapping portions 409, 452 of the N⁻ doped region 450 and the P⁻ doped region 408. As the respective overlapping portions 409, 452 of the N⁻ doped region 450 and the P⁻ doped region 408 are arranged adjacent to each other, side by side in a vertical direction or in a thickness direction of the layer 404, the PN diode formed by the overlapping portions 409, 452 is a vertical diode having the vertical PN junction 462. A remaining non-overlapping portion of the N⁻ doped region 450 outside of the PN junction 462 may be formed over an intrinsic Si region 422 of the Si layer 404.

Referring to FIG. 4D, a third masking layer 490 may be formed over the Si layer 404 and patterned to provide an opening 492. During a third implantation step, a high dose or concentration of about $1\times10^{21}/cm^3$ of N-type dopants may be implanted into the Si layer 404 through the opening 492 at a high energy of about 130 keV to form an N⁺ contact region (e.g. heavily N-doped region) 412. The third masking layer 490 may then be removed.

The N⁺ contact region 412 may be formed towards one side of the Si layer 404, adjacent to the N⁻ doped region 406 and the N⁻ doped region 450. The N⁺ contact region 412 may be in contact with an end region of the N⁻ doped region 406 and an end region of the N⁻ doped region 450, away from the PN junctions 410, 462. The N⁺ contact region 412 may extend through the entire thickness of the Si layer 404. As shown in FIG. 4D, the N⁺ contact region 412 is spaced apart from the P⁻ doped region 408, with the intrinsic Si region 422 in between.

Referring to FIG. 4E, a fourth masking layer 494 may be formed over the Si layer 404 and patterned to provide an opening 496. During a fourth implantation step, a high dose or concentration of about $1\times10^{21}/cm^3$ of P-type dopants may be implanted into the Si layer 404 through the opening 496 at a high energy of about 27 keV to form a P⁺ contact region (e.g. heavily P-doped region) 414. The fourth masking layer 494 may then be removed.

The P⁺ contact region 414 may be formed towards an opposite side of the Si layer 404, adjacent to the P⁻ doped region 408. The P⁺ contact region 414 may be in contact with an end region of the P⁻ doped region 408, away from the PN junctions 410, 462. The P⁺ contact region 414 may extend through the entire thickness of the Si layer 404. As shown in FIG. 4E, the P⁺ contact region 414 is spaced apart from the N⁻ doped region 406, with the intrinsic Si region 420 in between. The P⁺ contact region 414 is also spaced apart from the N⁻ doped region 450, with the intrinsic Si region 423 in between.

Figure 4G:
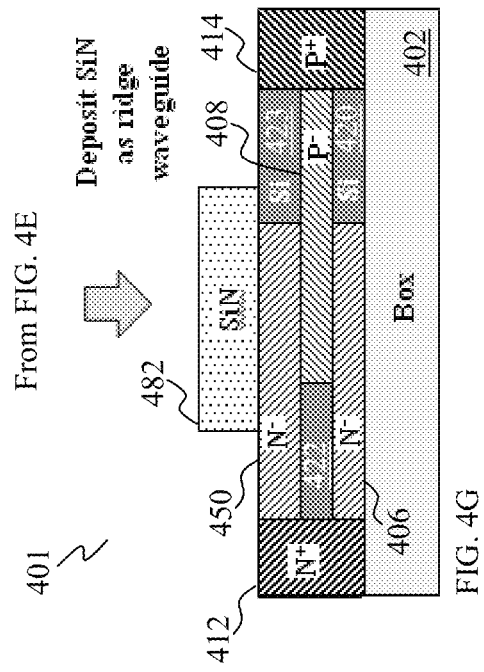
Figure 4F:
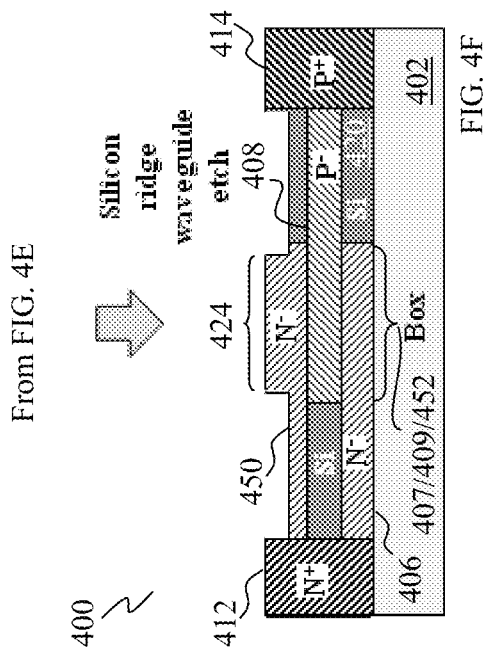

Referring to FIG. 4F, an etching process may be carried out to etch the N⁻ doped region 450 and the intrinsic Si region 423 so as to form a Si ridge waveguide 424 containing the N⁻ doped region 450, over the N⁻ doped region 406 and the P⁻ doped region 408, and spaced apart from the N⁺ contact region 412 and the P⁺ contact region 414. The Si ridge waveguide 424 may overlap with the overlapping portions 407, 409, 452, and therefore may also overlap with the PN junctions 410, 462 and the PN diodes. Therefore, an optical modulator 400 may be formed, having back to back vertical PN diodes.

Referring to FIG. 4G, alternatively, a ridge structure 482, e.g. a silicon nitride (SiN) ridge structure, may be deposited over the Si layer 404, over the N⁻ doped region 406, the P⁻ doped region 408 and the N⁻ doped region 450, to form a ridge waveguide. The ridge structure 482 may overlap with the PN junctions 410, 462 and the PN diodes. Therefore, an optical modulator 401 may be formed, having back to back vertical PN diodes.

FIGS. 5A to 5G show, as cross-sectional views, various processing stages of a method for forming an optical modulator, according to various embodiments, illustrating a fabrication process flow to form a vertical PN diode in a silicon-on-insulator (SOI) substrate.

Referring to FIG. 5A, a silicon-on-insulator (SOI) substrate 580 may be provided, the SOI substrate 580 having a buried oxide (BOX) layer 502 and a silicon layer 504 over the BOX layer 502.

Referring to FIG. 5B, a first masking layer 582 may be formed over the Si layer 504 and patterned to provide an opening 584. During a first implantation step, a low dose or concentration of about $1\times10^{18}/cm^3$ of N-type dopants may be implanted into the Si layer 504 through the opening 584 at different energy values, for example at a low energy of about 50 keV and at a high energy of about 100 keV to form an N⁻ doped region (e.g. lightly N-doped region) 506. The first masking layer 582 may then be removed. The N⁻ doped region 506 may for example be a first doped region. The N⁻ doped region 506 may be a buried region. The N⁻ doped region 506 may extend throughout the entire thickness of the Si layer 504. As shown in FIG. 5B, the N⁻ doped region 506 may be formed as a planar region.

Referring to FIG. 5C, a second masking layer 586 may be formed over the Si layer 504 and patterned to provide an opening 588. During a second implantation step, a low dose or concentration of about $2\times10^{18}/cm^3$ of P-type dopants may be implanted into the Si layer 504 through the opening 588 at a moderate energy of about 27 keV to form a P⁻ doped region (e.g. lightly P-doped region) 508. The second masking layer 586 may then be removed. The P⁻ doped region 508 may for example be a second doped region. The P⁻ doped region 508 may be a buried region. As shown in FIG. 5C, the P⁻ doped region 508 may be formed as a planar region.

As shown in FIG. 5C, the P⁻ doped region 508 may be formed extending partially into the N⁻ doped region 506 and in contact with the N⁻ doped region 506. A portion 509 of the P⁻ doped region 508 that is within the N⁻ doped region 506 may be sandwiched between a lower portion 507a of the N⁻ doped region 506 and an upper portion 507b of the N⁻ doped region 506. A PN junction 510 may be formed between the portion 509 of the P⁻ doped region 508 overlapping with the lower portion 507a of the N⁻ doped region 506, and another PN junction 562 may be formed between the portion 509 of the P⁻ doped region 508 overlapping with the upper portion 507b of the N⁻ doped region 506. Therefore, an NPN arrangement may be formed in the vertical direction, with two vertical PN junctions 510, 562. As the respective overlapping portions 507a, 509, 507b are arranged adjacent to each other, side by side in a vertical direction or in a thickness direction of the layer 504, the PN diode formed by the lower portion 507a of the N⁻ doped region 506 and the portion 509 of the P⁻ doped region 508 is a vertical diode, and the PN diode formed by the upper portion 507b of the N⁻ doped region 506 and the portion 509 of the P⁻ doped region 508 is a vertical diode. A remaining non-overlapping portion of the P⁻ doped region 508 outside of the PN junctions 510, 562 may be formed over an intrinsic Si region 520 of the Si layer 504. There may also be a remaining non-overlapping portion of the N⁻ doped region 506 outside of the PN junctions 510, 562.

Referring to FIG. 5D, a third masking layer 590 may be formed over the Si layer 504 and patterned to provide an opening 592. During a third implantation step, a high dose or concentration of about $1\times10^{20}/cm^3$ of N-type dopants may be implanted into the Si layer 504 through the opening 592 at a high energy of about 80 keV and a low energy of about 15 keV to form an N⁺ contact region (e.g. heavily N-doped region) 512. The third masking layer 590 may then be removed.

The N⁺ contact region 512 may be formed towards one side of the Si layer 504, adjacent to the N⁻ doped region 506. The N⁺ contact region 512 may be in contact with an end region of the N⁻ doped region 506, away from the PN junctions 510, 562. The N⁺ contact region 512 may extend through the entire thickness of the Si layer 504. As shown in FIG. 5D, the N⁺ contact region 512 is spaced apart from the P⁻ doped region 508.

Referring to FIG. 5E, a fourth masking layer 594 may be formed over the Si layer 504 and patterned to provide an opening 596. During a fourth implantation step, a high dose or concentration of about $1\times10^{20}/cm^3$ of P-type dopants may be implanted into the Si layer 504 through the opening 596 at a high energy of about 27 keV and a low energy of about 10 keV to form a P⁺ contact region (e.g. heavily P-doped region) 514. The fourth masking layer 594 may then be removed.

The P⁺ contact region 514 may be formed towards an opposite side of the Si layer 504, adjacent to the P⁻ doped region 508. The P⁺ contact region 514 may be in contact with an end region of the P⁻ doped region 508, away from the PN junctions 510, 562. The P⁺ contact region 514 may extend through the entire thickness of the Si layer 504. As shown in FIG. 5E, the P⁺ contact region 514 is spaced apart from the N⁻ doped region 506, with the intrinsic Si regions 520, 523 in between.

Referring to FIG. 5F, an etching process may be carried out to etch the N⁻ doped region 506 and the intrinsic Si region 523 so as to form a Si ridge waveguide 524 containing the N⁻ doped region 506, over the P⁻ doped region 508, and spaced apart from the N⁺ contact region 512 and the P⁺ contact region 514. The Si ridge waveguide 524 may overlap with the overlapping portions 507a, 509, 507b, and therefore may also overlap with the PN junctions 510, 562 and the PN diodes. Therefore, an optical modulator 500 may be formed, having back to back vertical PN diodes.

Referring to FIG. 5G, alternatively a ridge structure 582, e.g. a silicon nitride (SiN) ridge structure, may be deposited over the Si layer 504, over the N⁻ doped region 506 and the P⁻ doped region 508, to form a ridge waveguide. The ridge structure 582 may overlap with the PN junctions 510, 562 and the PN diodes. Therefore, an optical modulator 501 may be formed, having back to back vertical PN diodes.

It should be appreciated that the methods of various embodiments, including the methods shown in FIGS. 3A to 3F, 4A to 4G and 5A to 5G, may also be employed to form an optical modulator using a silicon substrate.

As described above, the fabrication process may employ ion implantations in order to form the vertical PN diode(s). The N⁻ and P⁻ doped regions may be formed by low dose, high/moderate or high/moderate/low energy implantation steps, followed by high dose, high energy implantation steps for forming the Ohmic contacts (N⁺ and P⁺ contact regions). Compared with conventional processes which require complicated implantation schemes, various embodiments provide a simple fabrication process for forming the vertical PN diode(s). The methods of various embodiments may only require the control of the implantation energy values in order to control the implantation depths for the respective N⁻ and P⁻ doped regions.

Figure 6:
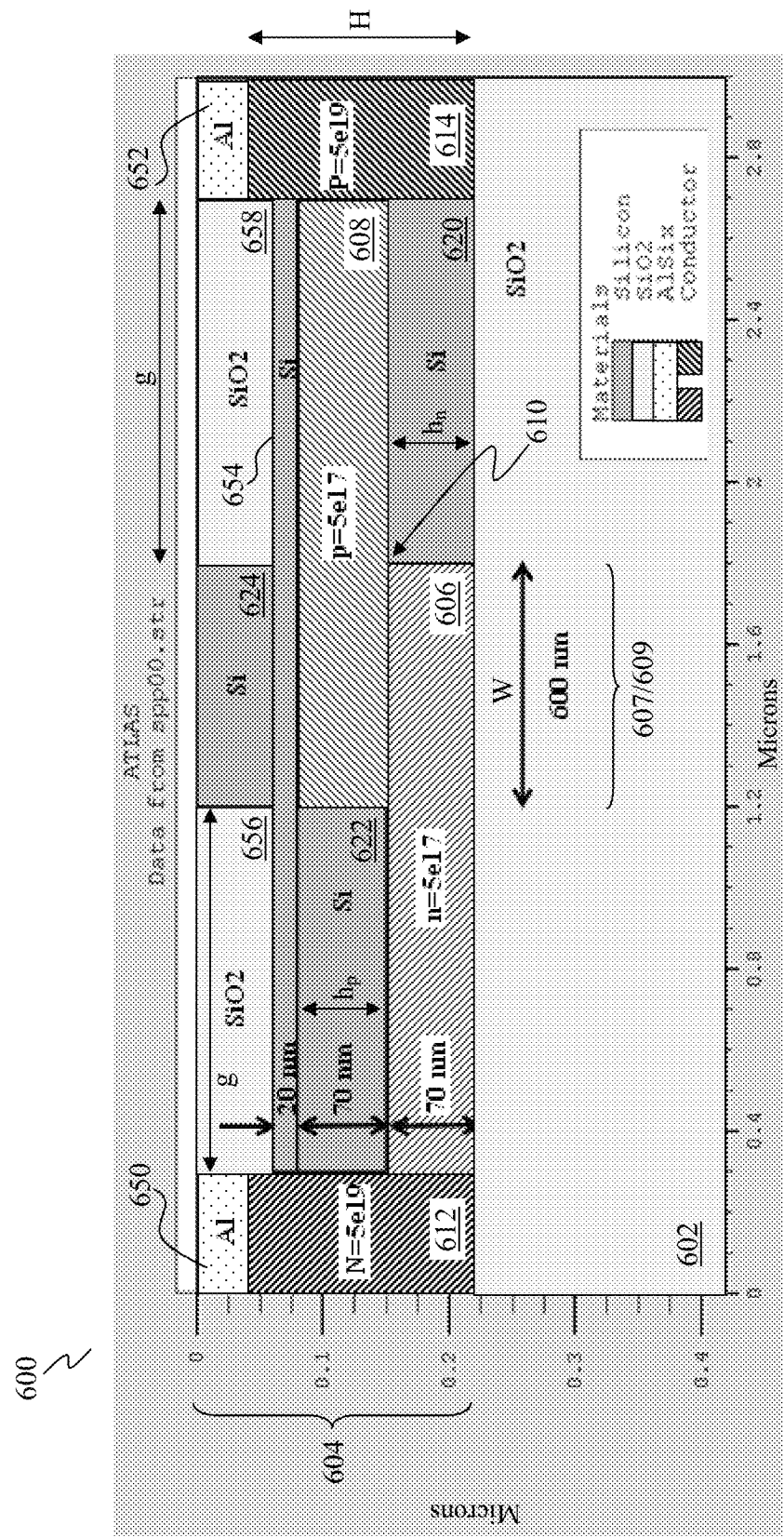
FIG. 6 shows a schematic cross sectional view of an optical modulator used for simulations, according to various embodiments.

FIG. 6 shows a schematic cross sectional view of an optical modulator 600 used for simulations, according to various embodiments. The optical modulator 600 may be fabricated using a silicon-on-insulator (SOI) wafer having a buried oxide (BOX) layer (e.g. $SiO_2$ layer) 602 and a silicon (Si) layer 604 (e.g. an epitaxial silicon layer of the SOI wafer) on top of the BOX layer 602. The optical modulator 600 may include an N⁻ doped region (e.g. lightly N-doped region) 606 in the Si layer 604 where the N⁻ doped region 606 has a dopant concentration of about 5e17 $cm^{-3}$, and a P⁻ doped region (e.g. lightly P-doped region) 608 in the Si layer 604 where the P⁻ doped region 608 has a dopant concentration of about 5e17 $cm^{-3}$. A portion 607 of the N⁻ doped region 606 may overlap with a portion 609 of the P⁻ doped region 608 to form a PN junction 610 between the overlapping portions 607, 609. Therefore, a PN diode may be formed by the overlapping portions 607, 609.

The optical modulator 600 may further include an N+ contact region (e.g. heavily N-doped contact region) 612 in the Si layer 604, in contact with the N− doped region 606. The N+ contact region 612 has a dopant concentration of about 5e19 cm−3. The optical modulator 600 may further include a P+ contact region (e.g. heavily P-doped contact region) 614 in the Si layer 604, in contact with the P− doped region 608. The P+ contact 614 has a dopant concentration of about 5e19 cm−3. An aluminium (Al) metal layer 650 may be provided on top of and in contact with the N+ contact region 612. An aluminium (Al) metal layer 652 may be provided on top of and in contact with the P+ contact region 614. Each of the aluminium (Al) metal layer 650 and the aluminium (Al) metal layer 652 may include aluminium silicide (AlSi$_x$).

An intrinsic Si region 620 of the Si layer 604 may separate the N− doped region 606 from the P+ contact region 614 while an intrinsic Si region 622 of the Si layer 604 may separate the P− doped region 608 from the N+ contact region 612. There may be an intrinsic Si region 654 of the Si layer 604 over the N− doped region 606 and the P− doped region 608.

The optical modulator 600 may further include a ridge waveguide 624 formed from the Si layer 604, overlapping with the PN junction 610. The ridge waveguide 624 may be separated from the N+ contact region 612 and the Al metal layer 650 by a SiO$_2$ portion 656. The ridge waveguide 624 may be separated from the P+ contact region 614 and the Al metal layer 652 by a SiO$_2$ portion 658.

FIGS. 7A to 7D show simulated free carrier distributions in a vertical PN diode for different DC (direct current) bias voltages respectively, according to various embodiments.

The simulated results shown in FIGS. 7A to 7D are obtained based on the embodiment of FIG. 6, with the following parameters: width (W) of 600 nm for the ridge waveguide 624, height (H) of 220 nm for each of the N+ contact region 612 and the P+ contact region 614, respective thicknesses (h$_p$ and h$_n$) of 70 nm for the N− doped region 606 and the P− doped region 608, and respective widths (g) of 900 nm for the SiO$_2$ portions 656, 658.

FIG. 7A shows a diagram 700 of simulated free holes distribution in the vertical PN diode of the optical modulator 600 having the PN junction 610 when no bias voltage is applied. FIG. 7B shows a diagram 710 of simulated free holes distribution in the vertical PN diode of the optical modulator 600 having the PN junction 610 upon application of a 0.5 V reverse bias DC voltage. FIG. 7C shows a diagram 720 of simulated free holes distribution in the vertical PN diode of the optical modulator 600 having the PN junction 610 upon application of a 1.5 V reverse bias DC voltage. FIG. 7D shows a diagram 730 of simulated free holes distribution in the vertical PN diode of the optical modulator 600 having the PN junction 610 upon application of a 4.5 V reverse bias DC voltage.

The results in FIGS. 7A to 7D shows that as the applied DC voltage is increased, the free holes may gradually get depleted near the interface (junction 610) of the PN diode. Upon application of a 4.5 V reverse bias, the free holes may be depleted completely from the waveguide region of the optical modulator 600.

Figure 8A:
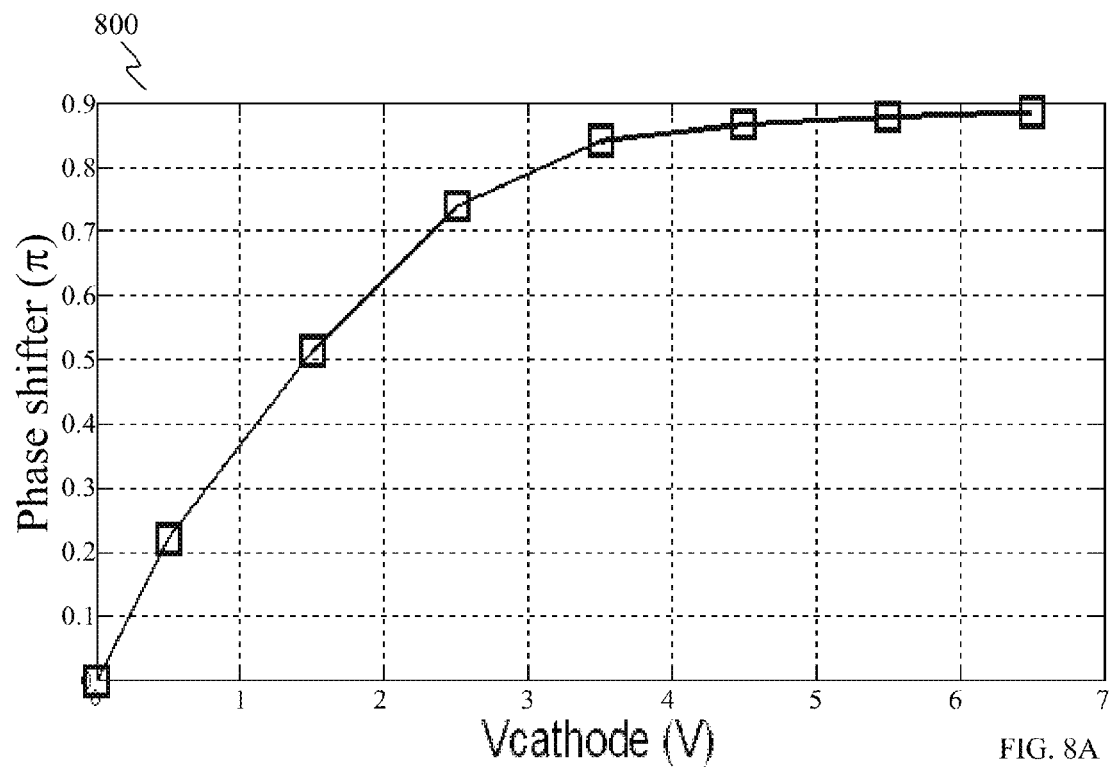
FIG. 8A shows a plot of simulated phase shift as a function of applied DC (direct current) bias, according to various embodiments.

FIG. 8A shows a plot 800 of simulated phase shift as a function of applied DC (direct current) bias, according to various embodiments. For the purpose of the simulation, the ridge waveguide has a length of about 4 mm and the light used has a wavelength of about 1550 nm. As may be observed from FIG. 8A, the phase shift may super-linearly increase with the increase of the DC bias, showing a modulation efficiency of V$_\pi$L$_\pi$ of about 1.66 V·cm at about 3.5 V DC bias. The smaller the value of V$_\pi$L$_\pi$, the higher the modulation efficiency is for the optical modulator.

Figure 8B:
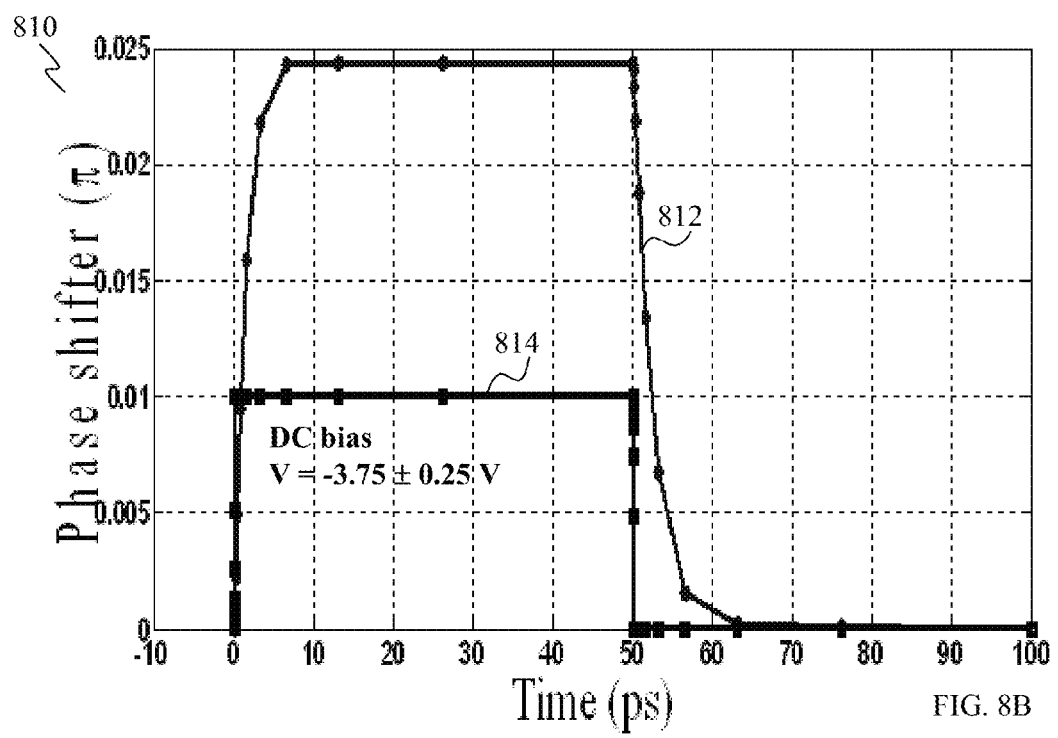
FIG. 8B shows a plot of the dynamic response of the optical modulator of various embodiments, upon a RF (radio frequency) signal supply.

FIG. 8B shows a plot 810 of the dynamic response of the optical modulator of various embodiments, upon a RF (radio frequency) signal supply, illustrating the simulated optical response 812 upon an electrical power supply with a DC bias of −3.75±0.25 V, as represented by 814. For the purpose of the simulation, the ridge waveguide has a length of about 4 mm and the light used has a wavelength of about 1550 nm. The simulated optical response 812 shows a simulated rise time, T$_{rise}$, and fall time, T$_{down}$, of approximately 3.5 ps, which suggests a larger than 40 GHz modulation bandwidth or modulation speed. The rise and fall times are defined as the times for the phase shift to change from about 10% to about 90%, and from about 90% to about 10% of its maximum amplitude, respectively.

Figure 9A:
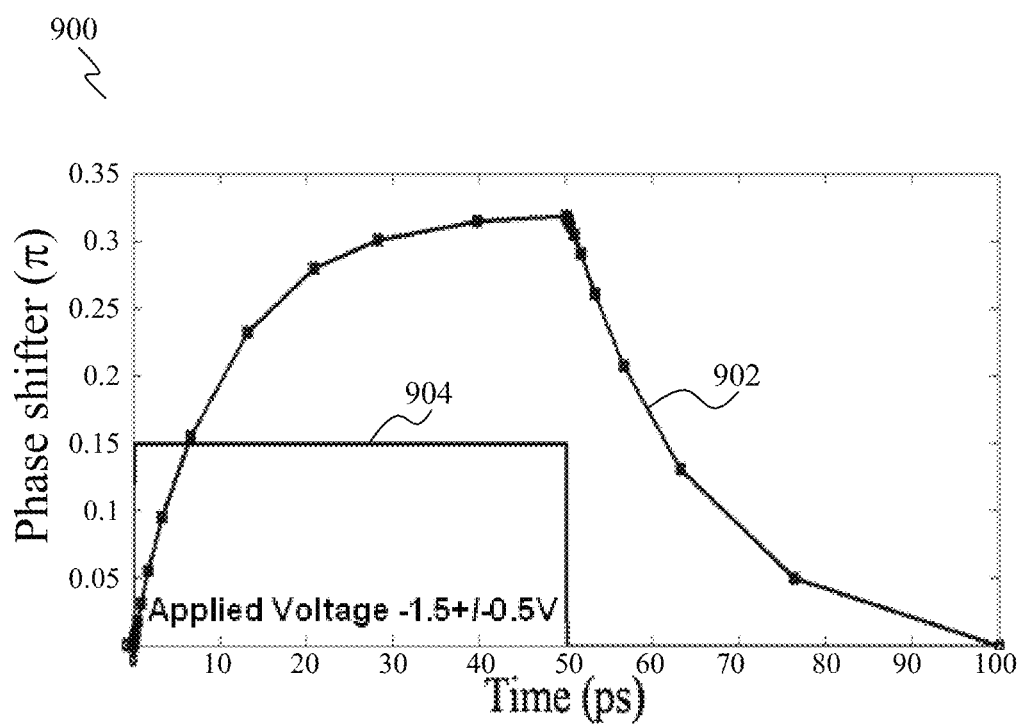
FIG. 9A shows a plot of transient response of an optical modulator having a vertical PN diode, according to various embodiments.

FIG. 9A shows a plot 900 of transient response of an optical modulator having a vertical PN diode, according to various embodiments. For example, the results in plot 900 may correspond to the optical modulator 300 (FIG. 3F). The plot 900 illustrates the simulation results for the switching speed, represented by 902, obtained by applying a voltage, represented by 904, of about −1.5±0.5 V for a duration of about 50 ps.

Figure 9B:
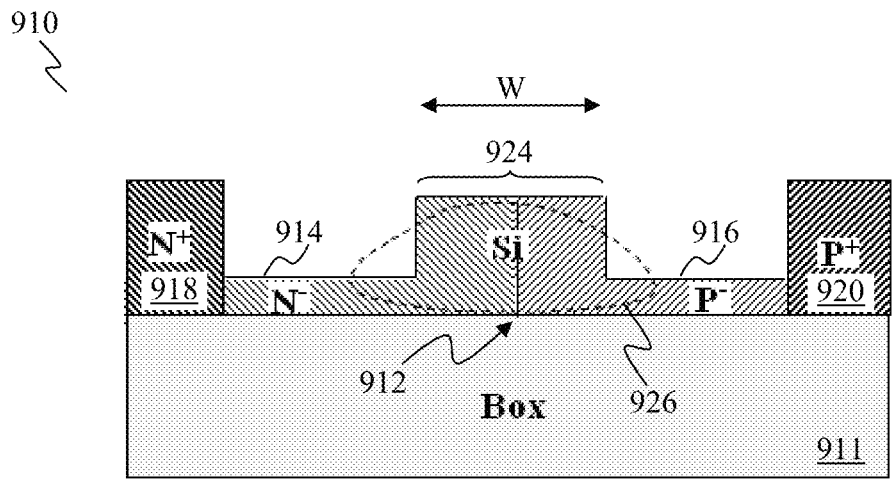
FIG. 9B shows a schematic diagram of an optical modulator having a horizontal PN junction.

For the purpose of comparison, the simulated results for an optical modulator having a horizontal PN are described below. FIG. 9B shows a schematic diagram of an optical modulator 910 having a horizontal PN junction 912 formed between an N− doped region 914 and a P− doped region 916 on a SOI substrate having a buried oxide (BOX) layer 911. The optical modulator 910 further includes an N+ contact region 918 in contact with the N− doped region 914, and a P+ contact region 920 in contact with the P− doped region 916. A ridge waveguide 924 may be formed containing parts of the N− doped region 914 and the P− doped region 916. The closed dashed loop 926 represents the mode field of an optical signal that may propagate through the optical modulator 910.

Figure 9C:
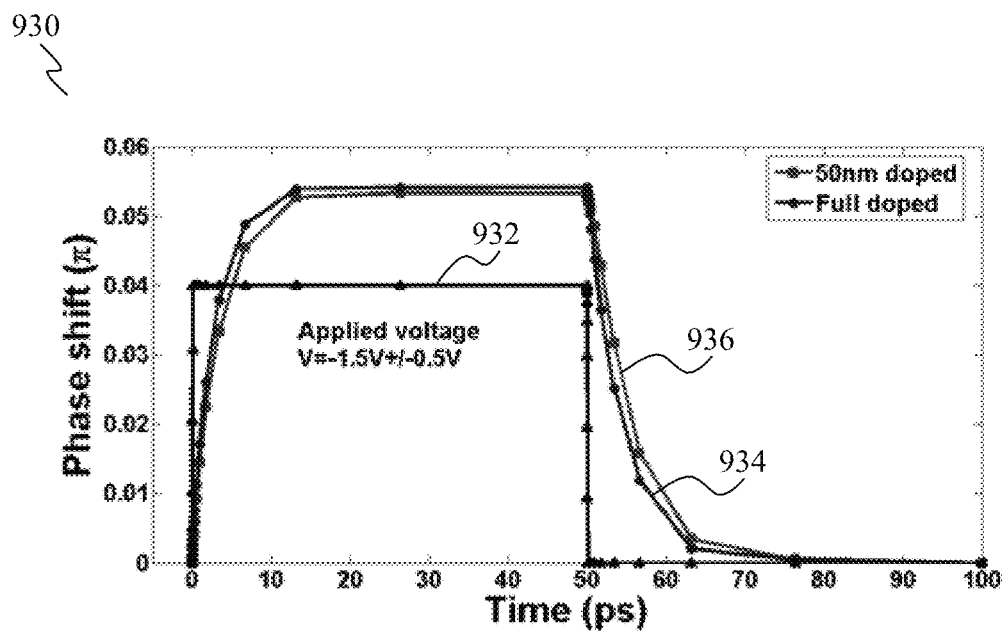
FIG. 9C shows a plot of transient response of the optical modulator of FIG. 9B.
Figure 9D:
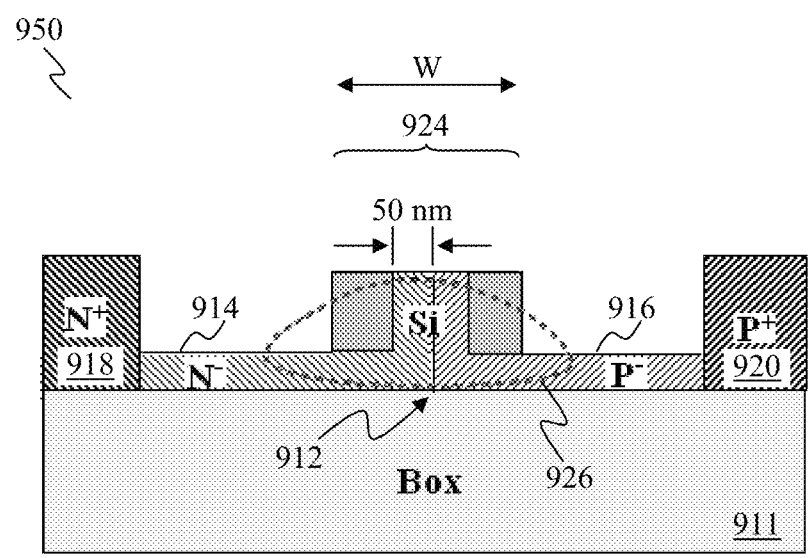
FIG. 9D shows a schematic diagram of an optical modulator having a horizontal PN junction.

FIG. 9C shows a plot 930 of transient response of the optical modulator of FIG. 9B. Plot 930 illustrates the simulation results for the switching speed, obtained by applying a voltage, represented by 932, of about −1.5±0.5 V for a duration of about 50 ps. Plot 930 shows the result 934 for a full doped condition, corresponding to the optical modulator 910 (FIG. 9B), and the result 936 for a 50 nm doped condition, corresponding to the optical modulator 950 (FIG. 9D).

The results in FIGS. 9A and 9C show that the optical modulator of various embodiments exhibits a higher sensitivity compared to conventional modulators. As may be observed in FIG. 9A, the maximum phase shift value is about 0.3, while the maximum phase shift value shown in FIG. 9C is about 0.05, thereby illustrating that the optical modulator of various embodiments, having a vertical PN diode, is about 6 times enhanced as compared to the optical modulators having a horizontal PN junction.

As described above, various embodiments may provide an optical modulator having a vertical PN diode, with enhanced modulation speed and modulation efficiency. The simulation results show a modulation speed higher than 40 GHz with V$_\pi$L$_\pi$ as small as 1.66 V·cm.

For conventional modulators employing a horizontal PN junction, there may be issues with misalignment in forming the horizontal PN junction. In contrast, in various embodiments, the vertical P-N junction may be formed, dependent on the implant energy and the dose intensity which may be easy to control. Furthermore, the vertical PN junction of various embodiments that is formed may have a larger area compared to a horizontal PN junction, and may also provide a higher sensitivity.

Further, as compared to conventional fabrication methods which require a high number of steps (e.g. tilt angle implantations), the methods of various embodiments may provide a simple process, with 4 times of implantations to form the vertical PN junction.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method for forming an optical modulator, the method comprising:
providing a substrate comprising a buried oxide layer;
implanting dopants of a first conductivity type into the substrate to form a first doped region;
implanting dopants of a second conductivity type into the substrate to form a second doped region;
wherein a portion of the second doped region is formed over and overlaps with a portion of the first doped region to form a junction between the respective portions of the first doped region and the second doped region, wherein the respective portions of the first doped region and the second doped region are in contact with each other,
wherein a remaining portion of the second doped region is located outside of the junction and formed over an intrinsic region of the substrate, wherein a bottom surface of the remaining portion of the second doped region overlaps and is directly on a top surface of the intrinsic region,
wherein the first doped region, the second doped region and the intrinsic region are formed over the buried oxide layer; and
wherein the intrinsic region is in between the remaining portion of the second doped region and the buried oxide layer; and
forming a ridge waveguide, wherein the ridge waveguide overlaps with at least a part of the junction.

2. The method as claimed in claim 1, wherein at least one of the first and second doped regions is a buried region.

3. The method as claimed in claim 1, wherein at least one of a concentration of the dopants of the first conductivity type at the first doped region or a concentration of the dopants of the second conductivity type at the second doped region is between about $1 \times 10^{17}/cm^3$ and about $1 \times 10^{18}/cm^3$.

4. The method as claimed in claim 1, wherein a concentration of the dopants of the first conductivity type is at least substantially equal to a concentration of the dopants of the second conductivity type.

5. The method as claimed in claim 1,
wherein implanting dopants of a first conductivity type into the substrate to form a first doped region is carried out at a first energy value, and
wherein implanting dopants of a second conductivity type into the substrate to form a second doped region is carried out at a second energy value that is lower than the first energy value.

6. The method as claimed in claim 5, wherein the first energy value is between about 10 keV and about 200 keV.

7. The method as claimed in claim 5, wherein the second energy value is between about 10 keV and about 200 keV.

8. The method as claimed in claim 1, further comprising:
implanting dopants of the first conductivity type into the substrate to form a first contact region adjacent to the first doped region.

9. The method as claimed in claim 8, wherein implanting dopants of the first conductivity type into the substrate to form a first contact region is carried out at an energy value between about 10 keV and about 200 keV.

10. The method as claimed in claim 8, further comprising:
implanting dopants of the second conductivity type into the substrate to form a second contact region adjacent to the second doped region.

11. The method as claimed in claim 10, wherein implanting dopants of the second conductivity type into the substrate to form a second contact region is carried out at an energy value between about 10 keV and about 200 keV.

12. The method as claimed in claim 1, further comprising:
implanting dopants of the first conductivity type into the substrate to form a third doped region, wherein the third doped region is formed over the first doped region, and wherein the portion of the second doped region is formed beneath and overlaps with a portion of the third doped region to form another junction between the respective portions of the third doped region and the second doped region.

13. The method as claimed in claim 12, wherein implanting dopants of the first conductivity type into the substrate to form a third doped region is carried out at an energy value between about 10 keV and about 200 keV.

14. The method as claimed in claim 12, wherein a concentration of the dopants of the first conductivity type at the first doped region is at least substantially equal to a concentration of the dopants of the first conductivity type at the third doped region.

15. The method as claimed in claim 12, wherein forming a ridge waveguide comprises removing material from the third doped region to form the ridge waveguide.

16. The method as claimed in claim 1,
wherein implanting dopants of a first conductivity type into the substrate to form a first doped region comprises changing an energy value used for implanting dopants of the first conductivity type into the substrate to form the first doped region across a thickness of the substrate, and
wherein the portion of the second doped region is formed partially within the first doped region.

17. The method as claimed in claim 16, wherein forming a ridge waveguide comprises removing material from the first doped region to form the ridge waveguide.

18. The method as claimed in claim 1, wherein forming a ridge waveguide comprises removing material from the substrate to form the ridge waveguide.

19. The method as claimed in claim 1, wherein forming a ridge waveguide comprises depositing a ridge structure to form the ridge waveguide.

20. The method as claimed in claim 1, wherein the first conductivity type is an N-type conductivity type, and wherein the second conductivity type is a P-type conductivity type.

21. A method for forming an optical modulator, the method comprising:
providing a substrate comprising a buried oxide layer;
implanting dopants of a first conductivity type into the substrate to form a first doped region;
implanting dopants of a second conductivity type into the substrate to form a second doped region;

wherein a portion of the second doped region is formed over and overlaps with a portion of the first doped region to form a junction between the respective portions of the first doped region and the second doped region, wherein the respective portions of the first doped region and the second doped region are in contact with each other;

wherein a remaining portion of the second doped region is located outside of the junction and formed over an intrinsic region of the substrate; and wherein the first doped region, the second doped region and the intrinsic region are formed over the buried oxide layer;

implanting dopants of the first conductivity type into the substrate to form a third doped region, wherein the third doped region is formed over the first doped region, and wherein the portion of the second doped region is formed beneath and overlaps with a portion of the third doped region to form another junction between the respective portions of the third doped region and the second doped region; and forming a ridge waveguide, wherein the ridge waveguide overlaps with at least a part of the junction.

* * * * *